(12) United States Patent
Ebisuno et al.

(10) Patent No.: US 12,193,269 B2
(45) Date of Patent: Jan. 7, 2025

(54) DISPLAY APPARATUS AND METHOD OF MANUFACTURING THE SAME

(71) Applicant: Samsung Display Co., Ltd., Yongin-si (KR)

(72) Inventors: Kohei Ebisuno, Yongin-si (KR); Kwanyong Pak, Yongin-si (KR); Youngwon Kim, Yongin-si (KR); Jinseok Oh, Yongin-si (KR); Jin Jeon, Yongin-si (KR); Jingoo Jung, Yongin-si (KR); Kyunghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 39 days.

(21) Appl. No.: 17/357,894

(22) Filed: Jun. 24, 2021

(65) Prior Publication Data

US 2022/0069045 A1  Mar. 3, 2022

(30) Foreign Application Priority Data

Sep. 3, 2020  (KR) .................. 10-2020-0112543

(51) Int. Cl.
| | |
|---|---|
| *H10K 59/121* | (2023.01) |
| *H01L 27/12* | (2006.01) |
| *H10K 50/844* | (2023.01) |
| *H10K 59/12* | (2023.01) |

(52) U.S. Cl.
CPC ..... *H10K 59/1213* (2023.02); *H01L 27/1262* (2013.01); *H10K 50/844* (2023.02); *H10K 59/1201* (2023.02)

(58) Field of Classification Search
CPC .......... H10K 59/1201; H10K 59/1231; H10K 59/124; H10K 77/10; H10K 50/858; H10K 50/844; H01L 27/1262
See application file for complete search history.

(56) References Cited

U.S. PATENT DOCUMENTS

| | | |
|---|---|---|
| 5,443,998 A | 8/1995 | Meyer |
| 8,937,313 B2 | 1/2015 | Chung et al. |
| 9,647,045 B2 | 5/2017 | Jung et al. |
| 11,101,340 B2 | 8/2021 | Sung et al. |
| 11,271,055 B2 | 3/2022 | Bae et al. |

(Continued)

FOREIGN PATENT DOCUMENTS

| | | |
|---|---|---|
| CN | 110890412 A | 3/2020 |
| CN | 110910781 A | 3/2020 |

(Continued)

*Primary Examiner* — Vongsavanh Sengdara
(74) *Attorney, Agent, or Firm* — Lewis Roca Rothgerber Christie LLP

(57) ABSTRACT

A display apparatus includes a main display area, and a component area including pixel groups spaced apart from each other and a transmission area between the pixel groups. The display apparatus further includes a substrate including a first base layer, a compensation layer, a first barrier layer, and a second barrier layer sequentially stacked on one another, a bottom metal layer between the first barrier layer and the second barrier layer, a buffer layer on the second barrier layer, main display elements on the substrate of the main display area, and auxiliary display elements on the substrate of the component area.

28 Claims, 22 Drawing Sheets

(56) References Cited

U.S. PATENT DOCUMENTS

| | | | | |
|---|---|---|---|---|
| 2009/0294828 A1* | 12/2009 | Ozawa | ............ | H10B 43/27 |
| | | | | 438/257 |
| 2013/0175534 A1* | 7/2013 | Chung | ............ | H01L 27/1218 |
| | | | | 977/890 |
| 2016/0293643 A1 | 10/2016 | Kim et al. | | |
| 2020/0176538 A1* | 6/2020 | Um | ............ | H10K 59/121 |
| 2020/0176539 A1* | 6/2020 | Sung | ............ | H10K 59/805 |
| 2020/0185627 A1* | 6/2020 | Fang | ............ | H10K 59/1213 |
| 2020/0227494 A1* | 7/2020 | Bae | ............ | H10K 59/126 |

FOREIGN PATENT DOCUMENTS

| KR | 10-2013-0081927 A | 7/2013 |
|---|---|---|
| KR | 10-2016-0053001 A | 5/2016 |
| KR | 10-2017-0024182 A | 3/2017 |
| KR | 10-1736925 B1 | 5/2017 |
| KR | 10-2020-0068171 A | 6/2020 |
| KR | 10-2020-0089380 A | 7/2020 |

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2020-0112543, filed on Sep. 3, 2020, the entire content of which is hereby incorporated by reference.

BACKGROUND

1. Field

One or more embodiments relate to display apparatuses and methods of manufacturing the same, and more particularly, to a display apparatus having improved product reliability and a method of manufacturing the display apparatus.

2. Description of the Related Art

Applications of display apparatuses have recently diversified. Moreover, because display apparatuses have become thinner and lighter, their range of use has increased.

Given that display apparatuses are utilized in various suitable ways, various suitable methods may be used to design the shapes of display apparatuses, and functions that may be connected or linked to display apparatuses may be increased.

SUMMARY

One or more aspects of embodiments of the present disclosure are directed towards a display apparatus having an extended display area such that an image may be displayed even in an area where a component that is an electronic element is arranged, and a method of manufacturing the display apparatus. However, the one or more aspects are only examples, and the scope of the disclosure is not limited thereto.

Additional aspects will be set forth in part in the description which follows and, in part, will become apparent from the description, or may be learned by practice of the presented embodiments of the disclosure.

According to one or more embodiments, a display apparatus includes a main display area, and a component area including pixel groups spaced apart from each other and a transmission area between the pixel groups. The display apparatus further includes a substrate including a first base layer, a compensation layer, a first barrier layer, and a second barrier layer sequentially stacked on one another, a bottom metal layer between the first barrier layer and the second barrier layer, a buffer layer on the second barrier layer, main display elements on the substrate of the main display area, and auxiliary display elements on the substrate of the component area.

The buffer layer may include a first buffer layer and a second buffer layer on the first buffer layer, a thickness of the first buffer layer may be 80 angstrom (Å) to 250 Å, and a thickness of the second buffer layer may be 1,000 Å to 4,000 Å.

The first buffer layer may include (e.g., be) silicon nitride, and the second buffer layer may include (e.g., be) silicon oxide.

A refractive index of the first buffer layer may be 1.8 to 2 (2.0), and a refractive index of the second buffer layer may be 1.3 to 1.6.

A thickness of the compensation layer may be 500 Å to 2,000 Å.

The compensation layer may include (e.g., be) silicon nitride.

A refractive index of the compensation layer may be 1.65 to 1.75.

A thickness of the first barrier layer may be 500 Å to 2,000 Å.

The first barrier layer may include (e.g., be) silicon oxide.

A refractive index of the first barrier layer may be 1.3 to 1.6.

A thickness of the second barrier layer may be 2,000 Å to 4,000 Å.

The first barrier layer and the second barrier layer may include (e.g., be) the same material.

The display apparatus may further include a second base layer below the first base layer, and a third barrier layer between the first base layer and the second base layer.

The bottom metal layer may include a first hole corresponding to the transmission area.

The bottom metal layer may be arranged to correspond to the auxiliary display elements.

The bottom metal layer may be arranged directly on the first barrier layer.

The display apparatus may further include a thin-film encapsulation layer that covers the main display elements and the auxiliary display elements, and the thin-film encapsulation layer may include at least one inorganic encapsulation layer and at least one organic encapsulation layer.

The first buffer layer may be arranged directly on the second barrier layer.

The second barrier layer may include a first layer, and a second layer on the first layer.

The second layer may be greater in amount of chlorine than the first layer.

The display apparatus may further include a component arranged below the substrate to correspond to the component area.

According to one or more embodiments, a method of manufacturing a display apparatus, the display apparatus including a main display area, and a component area including pixel groups spaced apart from each other and a transmission area between the pixel groups, the method includes the operations (acts) of forming a compensation layer on a first base layer, forming a first barrier layer on the compensation layer, forming a bottom metal layer on the first barrier layer, forming a second barrier layer on the bottom metal layer, and forming a buffer layer on the second barrier layer.

The forming of the buffer layer may include forming a first buffer layer on the second barrier layer, and forming a second buffer layer on the first buffer layer.

The forming of the first buffer layer may include forming the first buffer layer on the second barrier layer by utilizing (e.g., using) a gas including (e.g., being) chlorine.

The method may further include, before the forming of the first buffer layer, radiating plasma including (e.g., being) chlorine ($Cl_2$) gas onto an upper surface of the second barrier layer.

A thickness of the first buffer layer may be 80 Å to 250 Å, and a thickness of the second buffer layer may be 1,000 Å to 4,000 Å.

The first buffer layer may include (e.g., be) silicon nitride, and the second buffer layer may include (e.g., be) silicon oxide.

A thickness of the first barrier layer may be 500 Å to 2,000 Å.

A thickness of the second barrier layer may be 2,000 Å to 4,000 Å.

The first barrier layer and the second barrier layer may include (e.g., be) the same material.

These and/or other aspects will become apparent and more readily appreciated from the following description of the embodiments, the claims, and the accompanying drawings.

BRIEF DESCRIPTION OF THE DRAWINGS

The above and other aspects and features of certain embodiments of the disclosure will become more apparent from the following description taken in conjunction with the accompanying drawings, in which.

DETAILED DESCRIPTION

Figure 1:
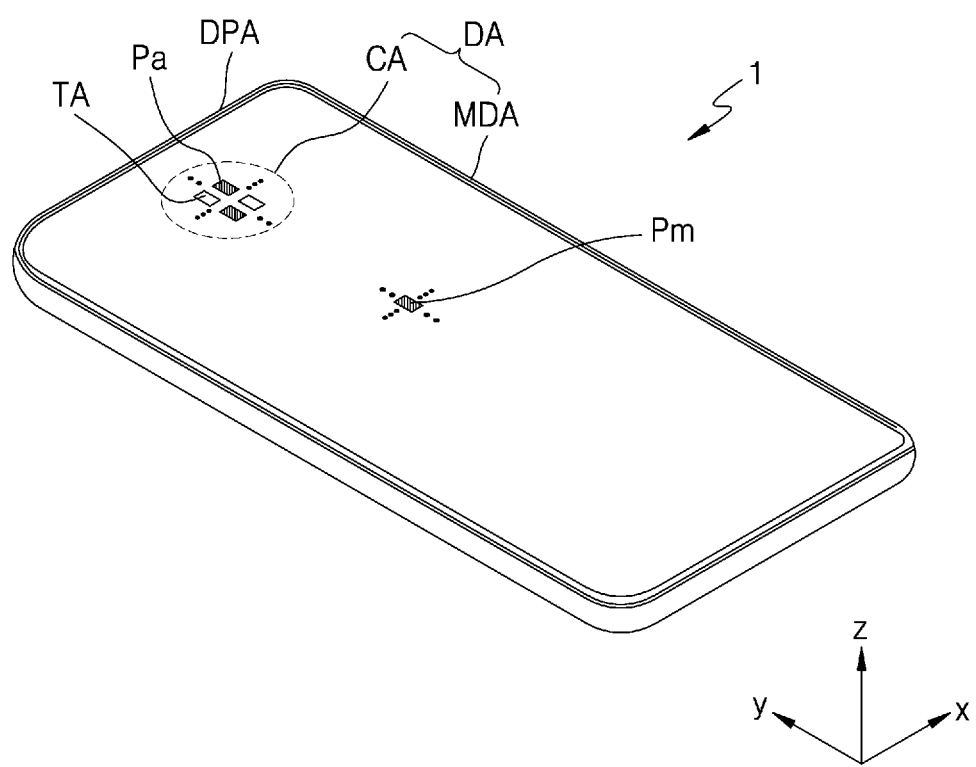
FIG. 1 is a perspective view of a display apparatus according to an embodiment.

Reference will now be made in more detail to embodiments of the present disclosure, examples of which are illustrated in the accompanying drawings, wherein like reference numerals refer to like elements throughout. In this regard, the present embodiments may have different suitable forms and should not be construed as being limited to or by the descriptions set forth herein. Accordingly, some embodiments are merely described below, by referring to the drawings, to explain aspects and features of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, the use of the term "may," when describing embodiments of the present disclosure, refers to "one or more embodiments of the present disclosure."

As the disclosure allows for various suitable changes and numerous embodiments, some embodiments will be illustrated in the drawings and described in more detail in the written description. Hereinafter, aspects and features of the present disclosure and a method for accomplishing (e.g., a method for manufacturing or fabricating) them will be described more fully with reference to the accompanying drawings, in which embodiments of the disclosure are shown. This disclosure may, however, be embodied in many different suitable forms and should not be construed as limited to or by the embodiments set forth herein.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and "comprising" used herein specify the presence of stated features and/or components, but do not preclude the presence or addition of one or more other features and/or components.

It will be understood that when a layer, region, or component is referred to as being "on" or "formed on" another layer, region, or component, it can be directly or indirectly on or formed on the other layer, region, or component. For example, one or more intervening layers, regions, and/or components may be present.

Sizes of elements in the drawings may be exaggerated for convenience of explanation. For example, because sizes and thicknesses of components in the drawings may be exaggerated for convenience of explanation, the following embodiments are not limited thereto. As used herein, the term "substantially," "about," "approximately," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

In the present specification, "A and/or B" indicates A or B, or A and B. The expression "at least one selected from A and B" indicates only A, only B, both A and B, or variations thereof.

In the following embodiments, that a wire extends in a first direction or a second direction may refer to or encompass not only extending in a straight line but also extending in zigzags or in a curve in the first direction or the second direction.

In the following embodiments, the term "planar" may refer to when an object is viewed from above, and the terms "sectional" and "cross-sectional" may refer to when a cross section formed by vertically cutting an object is viewed from the side. In the following embodiments, the term "overlapping" may encompass "planar" overlapping and "cross-sectional" overlapping.

One or more embodiments of the disclosure will be described below in more detail with reference to the accompanying drawings. Those components that are the same, or that are in correspondence, are rendered (e.g., referenced or indicated by) the same reference numeral regardless of the figure number.

FIG. 1 is a perspective view of a display apparatus 1 according to an embodiment.

Referring to FIG. 1, the display apparatus 1 includes a display area DA, and a peripheral area DPA outside the display area DA. The display area DA includes a component area CA, and a main display area MDA at least partially around or surrounding the component area CA. For example, the component area CA and the main display area MDA may individually or together display an image. The peripheral area DPA may be a non-display area in which no display elements are arranged. The display area DA may be partially or entirely surrounded by the peripheral area DPA. In some embodiments, the peripheral area DPA may be around the display area DA.

FIG. 1 illustrates one component area CA located within the main display area MDA. According to an embodiment, the display apparatus 1 may have two or more component areas CA, and the component areas CA may have different shapes and different sizes. When viewed in a direction approximately or substantially normal or perpendicular to an upper surface of the display apparatus 1 (e.g., when viewed in a plan view), the component area CA may have any of various suitable shapes such as a circular shape, an oval shape, a polygonal shape (e.g., a rectangular shape), a star shape, or a diamond shape. In FIG. 1, when viewed in the direction approximately or substantially normal or perpendicular to the upper surface of the display apparatus 1, the component area CA is arranged at the center of an upper portion (in a +y-axis direction) of the main display area MDA having an approximately rectangular shape, but the component area CA is not limited thereto. For example, the component area CA may be arranged at (e.g., on) one side, for example, a right upper side or left upper side, of the main display area MDA having an approximately or substantially rectangular shape.

The display apparatus 1 may provide (e.g., display) an image by utilizing (e.g., using) main subpixels Pm arranged in the main display area MDA and auxiliary subpixels Pa arranged in the component area CA.

In the component area CA, as will be described later with reference to FIG. 2, a component 40, which is an electronic element, may be arranged below a display panel to correspond to the component area CA. For example, the component 40 may be in (e.g., overlap) the component area CA in the plan view. The component 40 may be a camera utilizing (e.g., using) infrared light, visible light, and/or the like, and/or may be a photographing device. In some embodiments, the component 40 may be a solar battery, a flash (e.g., a flash to be used with a camera or a flash light), an illuminance sensor, a proximity sensor, and/or an iris sensor. In some embodiments, the component 40 may have a function of receiving sound. In order to minimize or reduce restrictions on the function of the component 40, the component area CA may include a transmission area TA capable of transmitting light and/or sound that is output from the component 40 to the outside and/or that travels from the outside toward the component 40. According to an embodiment, when light is transmitted through the component area CA, a light transmittance at (e.g., of) the component area CA and/or the transmission area TA may be about 15% or greater, for example, 25% or greater, 40% or greater, 50% or greater, 85% or greater, or 90% or greater.

Auxiliary subpixels Pa may be arranged in the component area CA. Each of the auxiliary subpixels Pa may emit light to provide a certain image. An image displayed by the component area CA is an auxiliary image and thus may have lower resolution than an image displayed by the main display area MDA. For example, when the component area CA includes the transmission area TA capable of transmitting light and/or sound, and when no subpixels are arranged in the transmission area TA, the number of auxiliary subpixels Pa that may be arranged on a unit area in the component area CA may be less than the number of main subpixels Pm arranged on a unit area in the main display area MDA.

Figure 2:
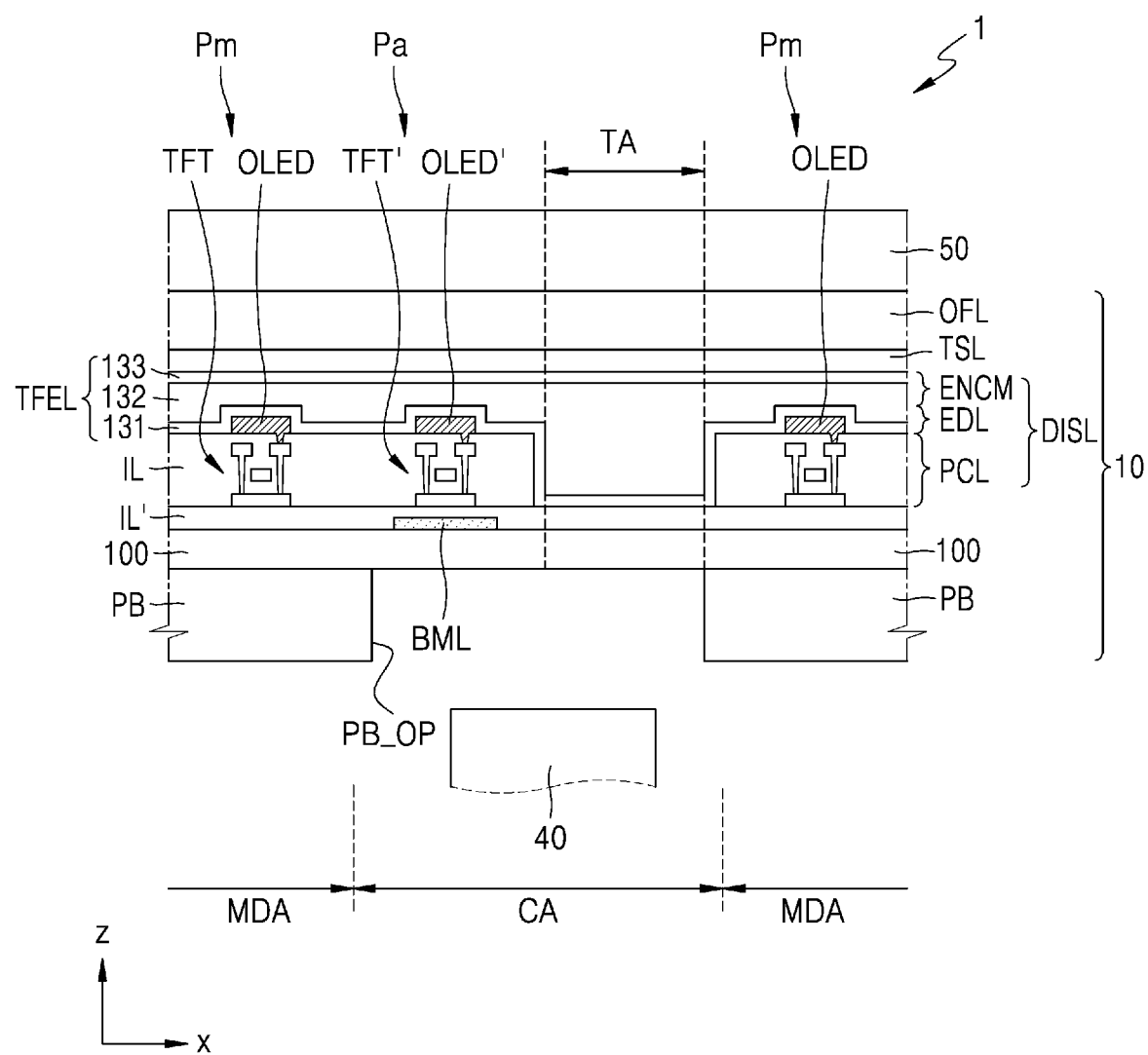
FIG. 2 is a schematic cross-sectional view of a portion of the display apparatus according to an embodiment.

FIG. 2 is a schematic cross-sectional view of a portion of the display apparatus 1 according to an embodiment.

Referring to FIG. 2, the display apparatus 1 may include a display panel 10 and the component 40 overlapped by the display panel 10. A cover window 50 may be further above the display panel 10 to protect the display panel 10.

The display panel 10 may include the component area CA overlapping the component 40, and the main display area MDA on which a main image is to be displayed. The display panel 10 may include a substrate 100, a display layer DISL on the substrate 100, a touch screen layer TSL, an optical functional layer OFL, and a panel protection member PB below the substrate 100. In some embodiments, the display panel 10 may also include the cover window 50.

The display layer DISL may include a circuit layer PCL including main and auxiliary thin-film transistors TFT and TFT', a display element layer EDL including main and auxiliary organic light-emitting diodes OLED and OLED' that are display elements, and an encapsulation member ENCM such as a thin-film encapsulation layer TFEL or an encapsulation substrate. Insulating layers IL and IL' may be arranged between the substrate 100 and the display layer DISL. In some embodiments, one or more of the insulating layers IL and IL' may be within the display layer DISL. In some embodiments, the insulating layer IL' may be between the substrate 100 and the display layer DISL, and the insulating layer IL may be within the display layer DISL. For example, the main and auxiliary thin-film transistors TFT and TFT' may be in the insulating layer IL.

The substrate 100 may include (e.g., be) an insulative material such as polymer resin, and may be a rigid substrate or a flexible substrate that is bendable, foldable, and/or rollable.

In the main display area MDA of the display panel 10, the main thin-film transistor TFT and the main organic light-emitting diode OLED coupled (e.g., connected) thereto may be arranged to realize a main subpixel Pm. In the component area CA of the display panel 10, the auxiliary thin-film transistor TFT' and the auxiliary organic light-emitting diode OLED' coupled (e.g., connected) thereto may be arranged to realize an auxiliary subpixel Pa. An area where the auxiliary subpixel Pa is arranged, in the component area CA, may be referred to as an auxiliary display area.

In the component area CA, a transmission area TA having no display elements arranged therein may be arranged. The transmission area TA may transmit a light/signal emitted by the component 40 arranged to correspond to the component area CA or a light/signal that is to be incident upon the component 40 (e.g., from outside the display apparatus 1). The auxiliary display area and the transmission area TA may be arranged alternately with each other in the component area CA.

A bottom metal layer BML may be arranged in the component area CA. The bottom metal layer BML may be arranged below the auxiliary thin-film transistor TFT' to correspond to (e.g., overlap with) the auxiliary thin-film transistor TFT' (e.g., in the plan view). For example, the bottom metal layer BML may be between the auxiliary thin-film transistor TFT' and the substrate 100. In some embodiments, the insulating layer IL' may cover the bottom metal layer BML such that the bottom metal layer BML is between the substrate 100 and the insulating layer IL', and such that the insulating layer IL' is between the bottom metal layer BML and the auxiliary thin-film transistor TFT'. The bottom metal layer BML may prevent or block external light from reaching the auxiliary thin-film transistor TFT'. According to an embodiment, a static voltage and/or a signal is applied to the bottom metal layer BML, and thus the bottom metal layer BML may protect or prevent a pixel circuit (e.g., the auxiliary subpixel Pa) from being damaged by electrostatic discharge, or the bottom metal layer BML may reduce such damage.

The display element layer EDL may be covered by the thin-film encapsulation layer TFEL or by the encapsulation substrate. According to some embodiments, the thin-film encapsulation layer TFEL may include at least one inorganic encapsulation layer and at least one organic encapsulation layer, as shown in FIG. 2. According to an embodiment, the thin-film encapsulation layer TFEL may include first and second inorganic encapsulation layers 131 and 133 and an organic encapsulation layer 132 therebetween.

The first and second inorganic encapsulation layers 131 and 133 may each include (e.g., be) at least one inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The organic encapsulation layer 132 may include (e.g., be) a polymer-based material. Examples of the polymer-based material may include (e.g., be) an acrylic resin, an epoxy-based resin, polyimide, and/or polyethylene.

According to some embodiments, when the display element layer EDL is sealed by the encapsulation substrate, the encapsulation substrate may be arranged to face (e.g., may overlap) the substrate 100 with the display element layer EDL therebetween. A gap may exist between the encapsulation substrate and the display element layer EDL. The encapsulation substrate may include (e.g., be) glass. A sealant including (e.g., being) frit and/or the like may be arranged between the substrate 100 and the encapsulation substrate, and may be arranged in the peripheral area DPA. The sealant arranged in the peripheral area DPA may be around (e.g., may surround) the display area DA and prevent or block moisture from permeating through the side surfaces of the display panel 10.

The touch screen layer TSL may obtain coordinate information based on an external input, for example, a touch event. The touch screen layer TSL may include a touch electrode and touch wires coupled (e.g., connected) to the touch electrode. The touch screen layer TSL may sense an external input according to a self capacitance method or a mutual capacitance method.

The touch screen layer TSL may be on the thin-film encapsulation layer TFEL. In some embodiments, the touch screen layer TSL may be separately provided on a touch substrate and then coupled to the upper surface of the thin-film encapsulation layer TFEL via an adhesive layer, such as an optically clear adhesive (OCA). According to an embodiment, the touch screen layer TSL may be provided directly on the thin-film encapsulation layer TFEL. In this case, no adhesive layers may be between the touch screen layer TSL and the thin-film encapsulation layer TFEL.

The optical functional layer OFL may be included to improve visibility. The optical functional layer OFL may include an anti-reflection layer. The anti-reflection layer may reduce reflectivity of light (external light) that is incident from an external source toward the display apparatus 1.

According to an embodiment, the anti-reflection layer may be a polarization film. The polarization film may include a linear planarization plate and a phase delay film such as a quarter-wave ($\lambda/4$) plate. The phase delay film may be on the touch screen layer TSL, and the linear planarization plate may be on the phase delay film.

According to an embodiment, the anti-reflection layer may include a filter layer including a black matrix and color filters. The color filters may be arranged by taking into account the colors of light beams respectively emitted by the subpixels of the display apparatus 1. For example, the filter layer may include a color filter of a red, green, and/or blue color.

According to an embodiment, the anti-reflection layer may include a destructive interference structure. The destructive interference structure may include a first reflection layer and a second reflection layer arranged on different layers. First reflected light and second reflected light respectively reflected by the first reflection layer and the second reflection layer may destructively interfere with each other, and thus the reflectance of external light may be reduced.

The cover window 50 may be arranged above the display panel 10 to protect the display panel 10. The optical functional layer OFL may be coupled (e.g., attached) to the cover window 50 (e.g., a lower surface of the cover window 50) by an OCA, and/or the optical functional layer OFL may be coupled (e.g., attached) to the touch screen layer TSL (e.g., an upper surface of the cover window 50) via an OCA.

The panel protection member PB may be coupled (e.g., attached) to a lower surface of the substrate 100 and may support and protect the substrate 100. The panel protection member PB may have an opening PB_OP corresponding to (e.g., overlapping in the plan view) the component area CA. The inclusion of the opening PB_OP in the panel protection member PB may improve the light transmittance of the component area CA. The panel protection member PB may include (e.g., be) polyethylene terephthalate (PET) and/or polyimide (PI).

The component area CA may have a larger area than an area where the component 40 is arranged. Accordingly, the area of the opening PB_OP included in the panel protection member PB may not be identical with the area of the component area CA.

A plurality of components 40 may be arranged in the component area CA. The plurality of components 40 may perform different functions. For example, the plurality of components 40 may include at least two selected from a camera (e.g., an imaging device), a solar cell, a flash, a proximity sensor, an illuminance sensor, and an iris sensor.

Figure 3:
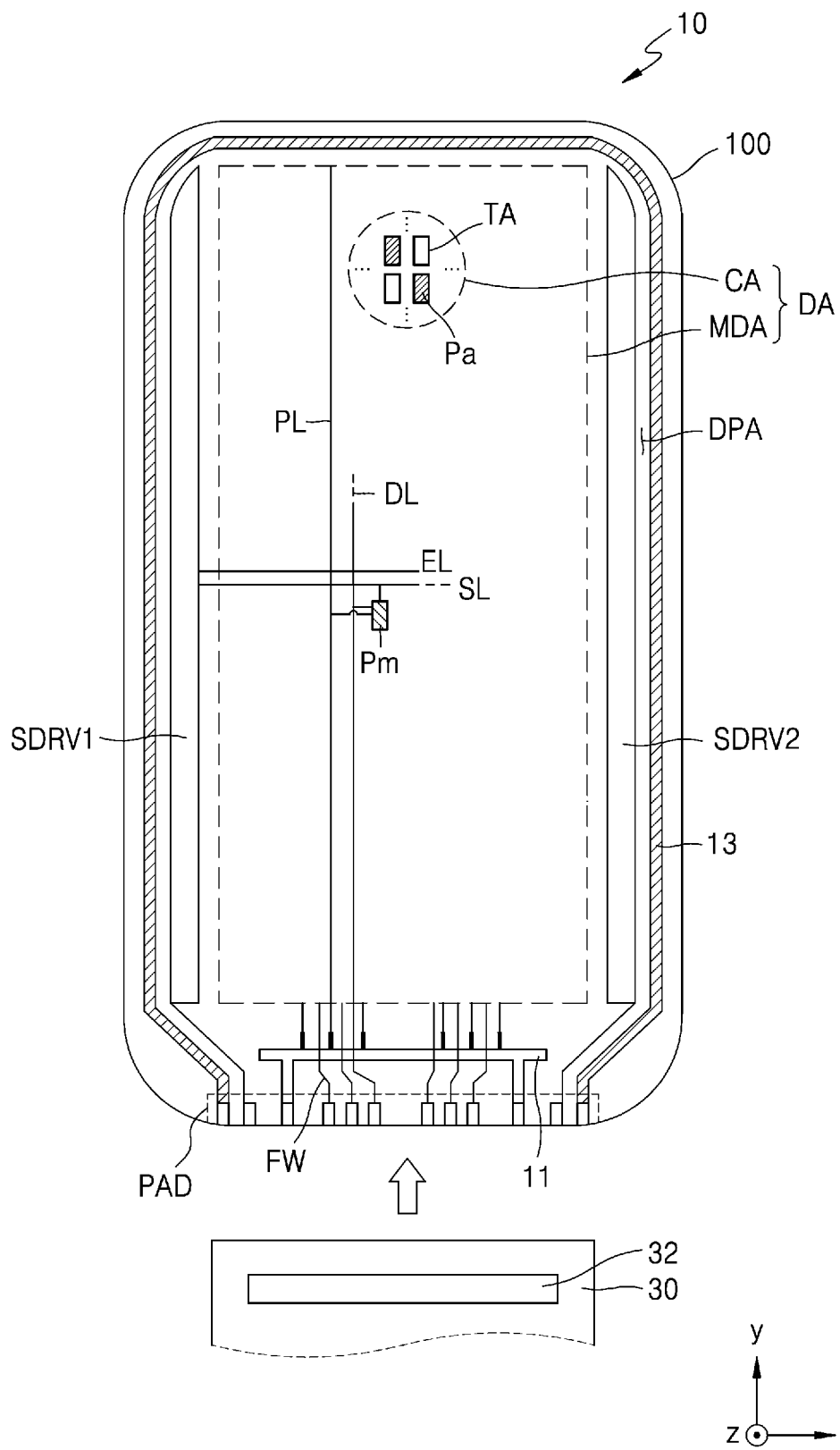
FIG. 3 is a schematic plan view of a display panel that may be included in the display apparatus of FIG. 1.

FIG. 3 is a schematic plan view of a display panel 10 that may be included in the display apparatus 1 of FIG. 1.

Referring to FIG. 3, various components that constitute the display panel 10 may be arranged on the substrate 100. The substrate 100 may include the display area DA and the peripheral area DPA around (e.g., surrounding) the display area DA. The display area DA may include a main display area MDA at (e.g., on) which a main image is displayed, and a component area CA which includes a transmission area TA and at (e.g., on) which an auxiliary image is displayed. The auxiliary image may form a single entire image together with the main image, or may form an image independent from the main image. For example, the auxiliary image and the main image may collectively form a single, integral image, or the auxiliary image and the main image may be independent from each other.

Main subpixels Pm may be arranged in the main display area MDA. Each of the main subpixels Pm may be implemented as a display element, such as an organic light-emitting diode OLED. Each of the main subpixels Pm may emit, for example, red light, green light, blue light, and/or white light. The main display area MDA may be covered with an encapsulation member and thus may be protected from ambient air, moisture, and/or the like.

The component area CA may be located at (e.g., on) one side (e.g., upper side) of the main display area MDA as described above, and/or may be arranged within the display area DA and surrounded by the main display area MDA. In some embodiments, the component area CA may be at the center of the main display area MDA. In some embodiments, the main display area MDA may be around (e.g., may surround) the component area CA. Auxiliary subpixels Pa may be arranged in the component area CA. Each of the auxiliary subpixels Pa may be implemented as a display element, such as an organic light-emitting diode OLED'. Each of the auxiliary subpixels Pa may emit, for example, red light, green light, blue light, and/or white light. The component CA may be covered with an encapsulation member and thus may be protected from ambient air, moisture, and/or the like.

The component area CA may have transmission areas TA. The transmission areas TA may be arranged to be around (e.g., to surround) the auxiliary subpixels Pa. For example, one or more auxiliary sub-pixels Pa from the auxiliary sub-pixels Pa may each have one or more transmission areas TA from the transmission areas TA at one or more sides of the auxiliary sub-pixel Pa. In some embodiments, the transmission areas TA may be arranged with each other in a lattice configuration, together with the auxiliary subpixels Pa. In some embodiments, the transmission areas TA and the auxiliary subpixels PA may be arranged with each other in a matrix pattern.

Because the component area CA has the transmission areas TA, a resolution of the component area CA may be lower than a resolution of the main display area MDA. For example, the resolution of the component area CA may be about ½, ⅜, ⅓, ¼, 2/9, ⅛, ⅑, or 1/16 of the resolution of the main display area MDA. For example, the resolution of the main display area MDA may be about 400 ppi or greater, and the resolution of the component area CA may be about 200 ppi or about 100 ppi.

Pixel circuits that drive the main and auxiliary subpixels Pm and Pa may be electrically coupled (e.g., connected) to outer circuits arranged in the peripheral area DPA, respectively. In the peripheral area DPA, a first scan driving circuit SDRV1, a second scan driving circuit SDRV2, a terminal unit PAD, a driving voltage supply line 11, and a common voltage supply line 13 may be arranged.

The first scan driving circuit SDRV1 may apply a scan signal, via a scan line SL, to each of the pixel circuits that drive the main and auxiliary subpixels Pm and Pa. The first scan driving circuit SDRV1 may apply a light-emission control signal to each of the pixel circuits via a light-emission control line EL. The second scan driving circuit SDRV2 may be located at (e.g., on) a side (e.g., right side) of the main display area MDA that is opposite to the side (e.g., left side) where the first scan driving circuit SDRV1 is located at (e.g., on), and may be approximately or substantially parallel (e.g., parallel) to the first scan driving circuit SDRV1. Some of the pixel circuits of the main subpixels Pm arranged in the main display area MDA may be electrically coupled (e.g., connected) to the first scan driving circuit SDRV1, and the remaining pixel circuits (e.g., the remaining pixel circuits of the main subpixels Pm) may be electrically coupled (e.g., connected) to the second scan driving circuit SDRV2. Some of the pixel circuits of the auxiliary subpixels Pa arranged in the component area CA may be electrically coupled (e.g., connected) to the first scan driving circuit SDRV1, and the remaining pixel circuits (e.g., the remaining pixel circuits of the auxiliary subpixels Pa) may be electrically coupled (e.g., connected) to the second scan driving circuit SDRV2. In some embodiments, the second scan driving circuit SDRV2 is not included.

The terminal unit PAD may be at (e.g., on) one side (e.g., lower side) of the substrate 100. The terminal unit PAD may be exposed without being covered by an insulating layer, and may be coupled (e.g., connected) to a display circuit board 30. A display driving unit 32 may be on the display circuit board 30.

The display driving unit 32 may generate a control signal that is transmitted to the first scan driving circuit SDRV1 and the second scan driving circuit SDRV2. The display driving unit 32 may generate a data signal, and the generated data signal may be transmitted to the pixel circuits of the main and auxiliary subpixels Pm and Pa via fanout wires FW and data lines DL coupled (e.g., connected) to the fanout wires FW.

The display driving unit 32 may supply a driving voltage ELVDD to the driving voltage supply line 11, and may supply a common voltage ELVSS to the common voltage supply line 13. The driving voltage ELVDD may be applied to the pixel circuits of the main and auxiliary subpixels Pm and Pa via a driving voltage line PL coupled (e.g., connected) to the driving voltage supply line 11, and the common voltage ELVSS may be coupled (e.g., connected) to the common voltage supply line 13 and thus may be applied to an opposite electrode of each display element (e.g., applied to the opposite electrode of each display element via the common voltage supply line 13).

The driving voltage supply line 11 may extend along and/or on a lower side of the main display area MDA along (e.g., in) an x direction (x-axis direction). The common voltage supply line 13 may have a loop shape of which one side is open (e.g., a U-shape in the plan view, which may be rotated by any suitable angle, for example, 180 degrees), and may be around (e.g., may surround) a portion of the main display area MDA.

Although FIG. 3 illustrates a single component area CA, in some embodiments, a plurality of component areas CA may be included. In this case, the plurality of component areas CA may be spaced apart from one another, and a first component (e.g., first camera) may be arranged in correspondence with one component area CA and a second component (e.g., second camera) may be arranged in correspondence with another component area CA. In some embodiments, a camera may be arranged in correspondence with one component area CA and an IR camera may be arranged in correspondence with another component area CA. The plurality of component areas CA may have different shapes and different sizes.

Each component area CA may have a polygonal shape. For example, each component area CA may have an octagonal shape. Each component area CA may have a shape of any of various suitable polygons such as a rectangle and a hexagon. However, the present disclosure is not limited thereto, and each component area CA may have any suitable shape (e.g., any suitable planar shape). The component area CA may be surrounded by the main display area MDA.

Figure 4:
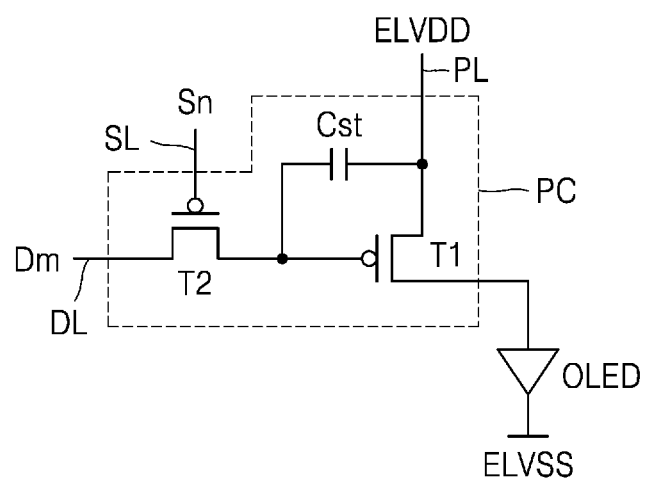
FIGS. 4 and 5 are each an equivalent circuit diagram of a pixel circuit for driving subpixels, according to an embodiment.
Figure 5:
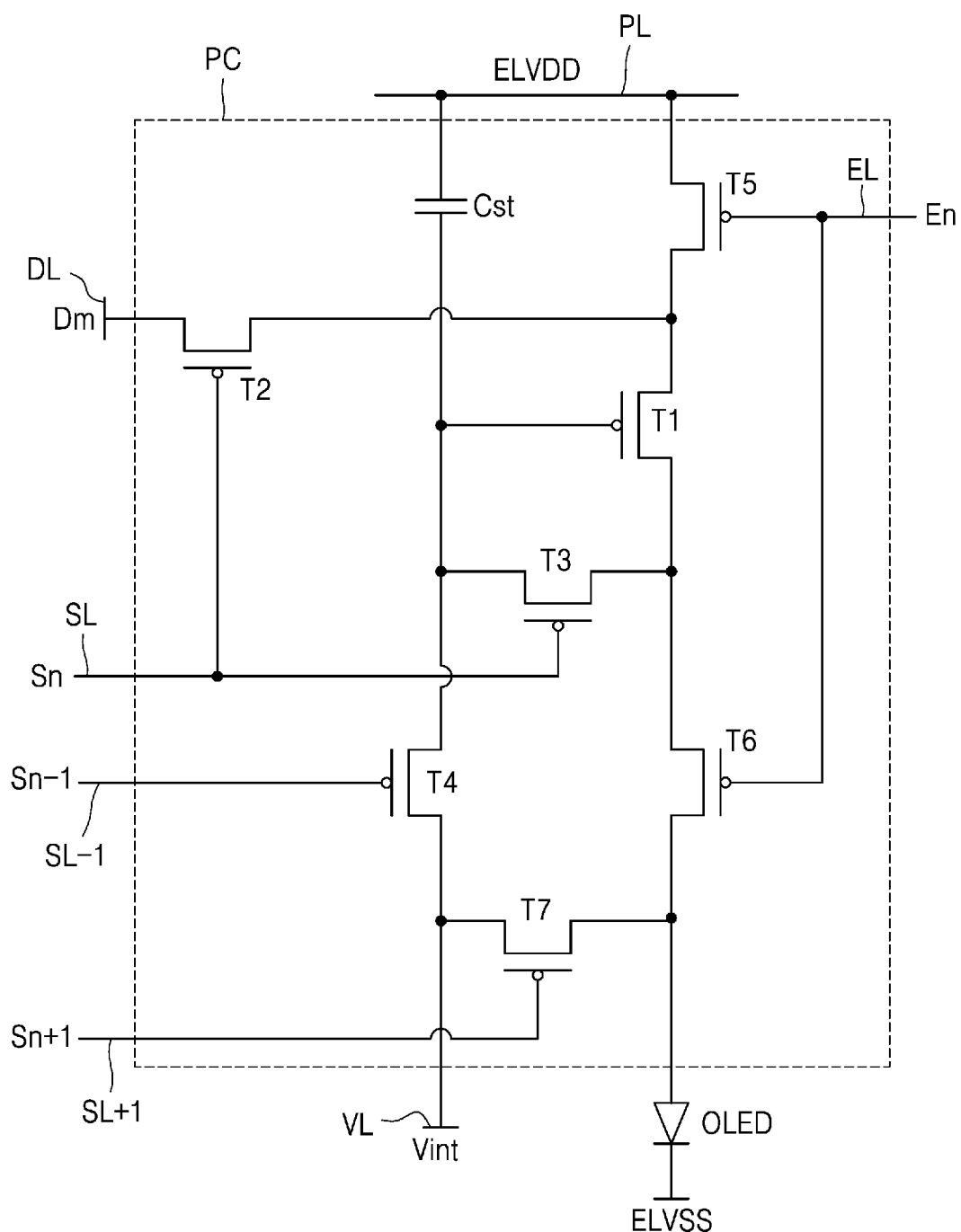

FIGS. 4 and 5 are each an equivalent circuit diagram of pixel circuit for driving subpixels, according to an embodiment.

Referring to FIG. 4, a pixel circuit PC may be coupled (e.g., connected) to an organic light-emitting diode OLED and may realize light emission (e.g., may emit or generate light) of subpixels. The pixel circuit PC includes a driving thin-film transistor T1, a switching thin-film transistor T2, and a storage capacitor Cst. The switching thin-film transistor T2 may be coupled (e.g., connected) to the scan line SL and the data line DL, and may transmit, to the driving thin-film transistor T1, a data signal Dm received via the data line DL according to a scan signal Sn received via the scan line SL.

The storage capacitor Cst may be coupled (e.g., connected) to the switching thin-film transistor T2 and a driving voltage line PL, and may store a voltage corresponding to a difference between a voltage received from the switching thin-film transistor T2 and the driving voltage ELVDD supplied to the driving voltage line PL.

The driving thin-film transistor T1 may be coupled (e.g., connected) to the driving voltage line PL and to the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness due to the driving current. For example, the brightness may correspond to (e.g., be proportional to) the driving current.

Although a case where the pixel circuit PC includes two thin-film transistors and one storage capacitor is illustrated in FIG. 4, embodiments are not limited thereto.

Referring to FIG. 5, a pixel circuit PC may include a driving thin-film transistor T1, a switching thin-film transistor T2, a compensating thin-film transistor T3, a first initializing thin-film transistor T4, an operation control thin-film transistor T5, a light-emission control thin-film transistor T6, and a second initializing thin-film transistor T7.

Although the pixel circuit PC includes signal lines, for example, a scan line SL, a previous scan line SL−1, a next scan line SL+1, a light-emission control line EL, and a data line DL, an initializing voltage line VL, and a driving voltage line PL in FIG. 5, embodiments are not limited thereto. According to an embodiment, at least one selected from the signal lines, for example, at least one selected from the scan line SL, the previous scan line SL−1, the next scan line SL+1, the light-emission control line EL, and the data line DL, and the initializing voltage line VL may be shared by neighboring pixel circuits.

A drain electrode of the driving thin-film transistor T1 may be electrically coupled (e.g., connected) to the organic light-emitting diode OLED via the light-emission control thin-film transistor T6. The driving thin-film transistor T1 may receive the data signal Dm according to a switching operation of the switching thin-film transistor T2 and may supply a driving current to the organic light-emitting diode OLED.

A gate electrode of the switching thin-film transistor T2 may be coupled (e.g., connected) to the scan line SL, and a source electrode thereof may be coupled (e.g., connected) to the data line DL. A drain electrode of the switching thin-film transistor T2 may be coupled (e.g., connected) to a source electrode of the driving thin-film transistor T1 and at the same time (e.g., and also) may be coupled (e.g., connected) to the driving voltage line PL via the operation control thin-film transistor T5.

The switching thin-film transistor T2 may be turned on according to the scan signal Sn received via the scan line SL and may perform a switching operation of transmitting the data signal Dm received from the data line DL to the source electrode of the driving thin-film transistor T1.

A gate electrode of the compensating thin-film transistor T3 may be coupled (e.g., connected) to the scan line SL. A source electrode of the compensating thin-film transistor T3 may be coupled (e.g., connected) to the drain electrode of the driving thin-film transistor T1 and at the same time (e.g., and also) may be coupled (e.g., connected) to a pixel electrode of the organic light-emitting diode OLED via the light-emission control thin-film transistor T6. A drain electrode of the compensating thin-film transistor T3 may be coupled (e.g., connected) to one electrode of the storage capacitor Cst, a source electrode of the first initializing thin-film transistor T4, and a gate electrode of the driving thin-film transistor T1. The compensating thin-film transistor T3 is turned on according to the scan signal Sn received via the scan line SL and couples (e.g., connects) the gate electrode and the drain electrode of the driving thin-film transistor T1 to each other, thus achieving diode-connection of the driving thin-film transistor T1.

A gate electrode of the first initializing thin-film transistor T4 may be coupled (e.g., connected) to the previous scan line SL−1. A drain electrode of the first initializing thin-film transistor T4 may be coupled (e.g., connected) to the initializing voltage line VL. A source electrode of the first initializing thin-film transistor T4 may be coupled (e.g., connected) to the one electrode of the storage capacitor Cst, the drain electrode of the compensating thin film transistor T3, and the gate electrode of the driving thin-film transistor T1. The first initializing thin-film transistor T4 may be turned on according to a previous scan signal Sn−1 received via the previous scan line SL−1 and may transmit an initializing voltage Vint to the gate electrode of the driving thin-film transistor T1 to thereby initialize a voltage of the gate electrode of the driving thin-film transistor T1.

A gate electrode of the operation control thin-film transistor T5 may be coupled (e.g., connected) to the light-emission control line EL. A source electrode of the operation control thin-film transistor T5 may be coupled (e.g., connected) to the driving voltage line PL. A drain electrode of the operation control thin-film transistor T5 is coupled (e.g., connected) to the source electrode of the driving thin-film transistor T1 and to the drain electrode of the switching thin-film transistor T2.

A gate electrode of the light-emission control thin-film transistor T6 may be coupled (e.g., connected) to the light-emission control line EL. A source electrode of the light-emission control thin-film transistor T6 may be coupled (e.g., connected) to the drain electrode of the driving thin-film transistor T1 and to the source electrode of the compensating thin-film transistor T3. A drain electrode of the light-emission control thin-film transistor T6 may be electrically coupled (e.g., connected) to the pixel electrode of the organic light-emitting diode OLED. The operation control thin-film transistor T5 and the light-emission control thin-film transistor T6 may be simultaneously or concurrently turned on according to a light-emission control signal En received via the light-emission control line EL, and thus the driving voltage ELVDD may be transmitted to the organic light-emitting diode OLED and the driving current may flow in the organic light-emitting diode OLED.

A gate electrode of the second initializing thin-film transistor T7 may be coupled (e.g., connected) to the next scan line SL+1. A source electrode of the second initializing thin-film transistor T7 may be coupled (e.g., connected) to the pixel electrode of the organic light-emitting diode OLED. A drain electrode of the second initializing thin-film transistor T7 may be coupled (e.g., connected) to the initializing voltage line VL. The second initializing thin-film transistor T7 may be turned on according to a next scan signal Sn+1 received via the next scan line SL+1 and may initialize the pixel electrode of the organic light-emitting diode OLED.

Although the first initializing thin-film transistor T4 and the second initializing thin-film transistor T7 are respectively coupled (e.g., connected) to the previous scan line SL−1 and the next scan line SL+1 in FIG. 5, embodiments are not limited thereto. According to an embodiment, both the first initializing thin-film transistor T4 and the second initializing thin-film transistor T7 may be coupled (e.g., connected) to the previous scan line SL−1 and may be driven according to the previous scan signal Sn−1.

Another electrode of the storage capacitor Cst may be coupled (e.g., connected) to the driving voltage line PL. The one electrode of the storage capacitor Cst may be coupled (e.g., connected) to the gate electrode of the driving thin-film transistor T1, the drain electrode of the compensating thin-film transistor T3, and the source electrode of the first initializing thin-film transistor T4.

An opposite electrode (for example, a cathode) of the organic light-emitting diode OLED may receive a common voltage ELVSS. The organic light-emitting diode OLED may receive the driving current from the driving thin film transistor T1 and emit light.

The pixel circuit PC is not limited to the number of thin-film transistors, the number of storage capacitors, and the circuit designs as described above with reference to FIGS. 4 and 5. The number of thin-film transistors, the number of storage capacitors, and a circuit design may suitably vary.

The pixel circuits PC driving a main subpixel Pm and an auxiliary subpixel Pa may be the same as each other or may be different from each other. For example, the pixel circuit PC of FIG. 5 may be utilized as each of the pixel circuits PC driving a main subpixel Pm and an auxiliary subpixel Pa. According to an embodiment, the pixel circuit PC of FIG. 5 may be utilized as a pixel circuit PC driving a main subpixel Pm, and the pixel circuit PC of FIG. 4 may be utilized as a pixel circuit PC driving an auxiliary subpixel Pa.

Figure 6:
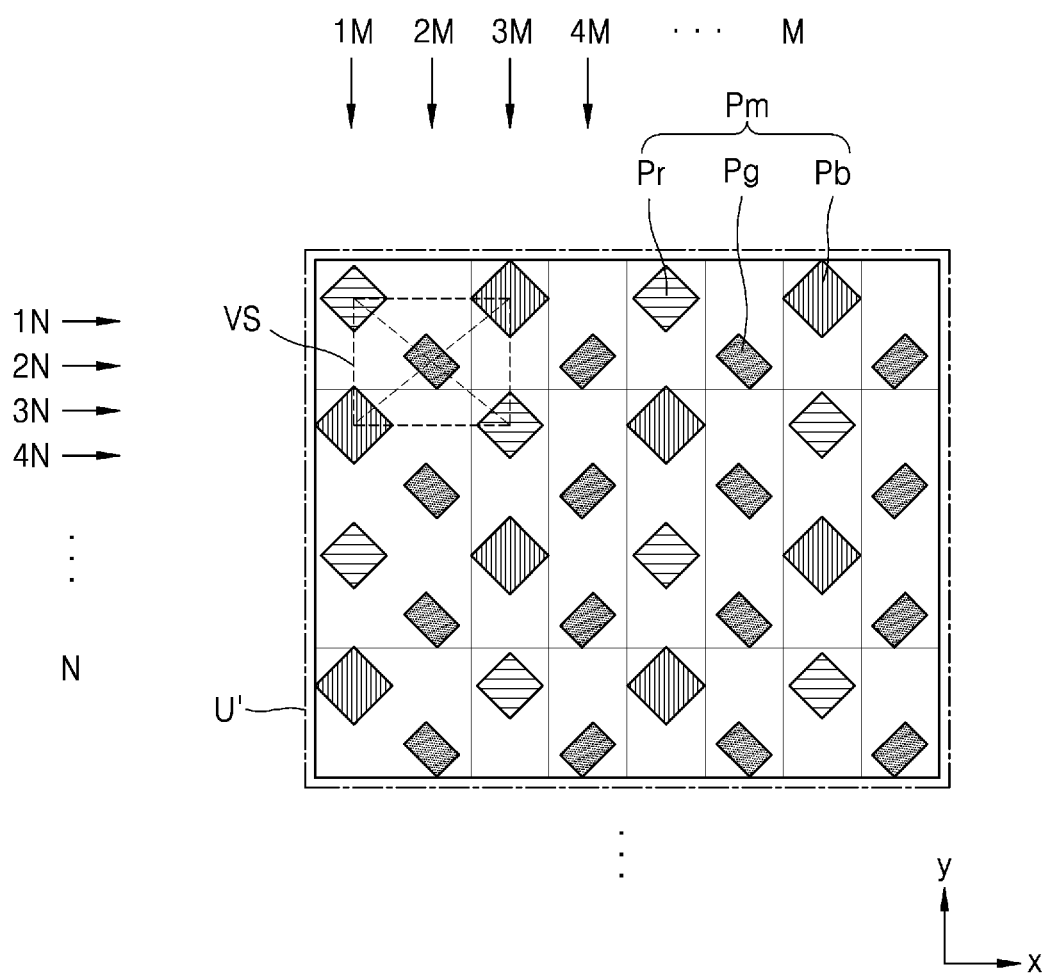
FIG. 6 is a schematic layout view illustrating a pixel arrangement structure in a main display area according to an embodiment.

FIG. 6 is a schematic layout view illustrating a pixel arrangement structure in the main display area MDA according to an embodiment.

A plurality of main subpixels Pm may be arranged in the main display area MDA. A subpixel, as used herein, refers to a light-emission area as a minimum unit that realizes (e.g., generates or emits) an image (e.g., light). When an organic light-emitting diode is utilized as a display element, the light-emission area may be defined by the opening of a pixel defining layer. This will be described later.

As shown in FIG. 6, the main subpixels Pm arranged with each other in the main display area MDA may have a PENTILE® (Trademark of Samsung Display Co., Ltd.) structure. For example, in some embodiments, the main subpixels Pm may be arranged with each other in a RGBG matrix. The main subpixels Pm may include first subpixels Pr, second subpixels Pg, and third subpixels Pb, and the first subpixels Pr, the second subpixels Pg, and the third subpixels Pb may emit light beams (e.g., light) of red, green, and blue colors, respectively.

A plurality of first subpixels Pr and a plurality of third subpixels Pb alternate with each other on a first row 1N (e.g., the plurality of first subpixels Pr and the plurality of third subpixels Pb are alternately arranged with each other on the first row 1N extending along an x-axis direction), a plurality of second subpixels Pg are spaced apart by a set or predetermined distance from each other on a second row 2N adjacent to the first row 1N (e.g., the plurality of second subpixels Pg are arranged with each other on the second row 2N extending along the x-axis direction and adjacent to the first row 1N along a y-axis direction perpendicular to the x-axis direction, wherein adjacent second subpixels Pg of the plurality of second subpixels Pg on the second row 2N are spaced apart from each other by the set or predetermined distance), a plurality of third subpixels Pb and a plurality of first subpixels Pr alternate with each other on a third row 3N adjacent to the second row 2N, and a plurality of second subpixels Pg are spaced apart by a set or predetermined distance from each other on a fourth row 4N adjacent to the third row 3N, and this pixel arrangement is repeated up to an N-th row. For example, the even numbered rows and the odd numbered rows may be alternately arranged with each other along the y-axis direction. In this case, the first subpixels Pb and the third subpixels Pr may be larger than the second subpixels Pg.

The plurality of first subpixels Pr and the plurality of third subpixels Pb on the first row 1N, and the plurality of second subpixels Pg on the second row 2N are arranged in a zigzag configuration.

A plurality of first subpixels Pr and a plurality of third subpixels Pb alternate with each other on a first column 1M (e.g., the plurality of first subpixels Pr and the plurality of third subpixels Pb are alternately arranged with each other on the first column 1M extending along the y-axis direction), a plurality of second subpixels Pg are spaced apart by a set or predetermined distance from each other on a second column 2M adjacent to the first column 1M (e.g., the plurality of second subpixels Pg are arranged with each other on the second column 2M extending along the y-axis direction and adjacent to the first column 1M along the x-axis direction, wherein adjacent second subpixels Pg of the plurality of second subpixels Pg on the second column 2M are spaced apart from each other by the set or predetermined distance), a plurality of third subpixels Pb and a plurality of first subpixels Pr alternate with each other on a third column 3M adjacent to the second column 2M, and a plurality of second subpixels Pg are spaced apart by a set or predetermined distance from each other on a fourth column 4M adjacent to the third column 3M, and this pixel arrangement is repeated up to an M-th column. For example, the even numbered columns and the odd numbered columns may be alternately arranged with each other along the x-axis direction.

Describing this pixel arrangement structure differently, first subpixels Pr may be arranged at first and third vertexes (e.g., first and third facing vertices) of the four vertexes of a virtual quadrilateral VS having a center point of a second subpixel Pg as its center point, and third subpixels Pb may be arranged at the remaining vertexes, namely, second and fourth vertexes. For example, when the virtual quadrilateral VS is a rectangle, the first and third vertexes may be connected by a virtual diagonal line that crosses the center of the virtual quadrilateral VS, and the second and fourth vertexes may be connected by a virtual diagonal line that crosses the center of the virtual quadrilateral VS. The virtual quadrilateral VS may be a rectangle, a rhombus, a square, or the like.

This pixel arrangement structure may be referred to as a PENTILE® matrix structure or a PENTILE® structure. By applying rendering, in which a color of a pixel is represented by sharing the colors of its adjacent pixels, a high resolution may be obtained via a small number of pixels.

Although the plurality of main subpixels Pm are arranged in a PENTILE® matrix structure in FIG. 6, embodiments are not limited thereto. For example, the plurality of main subpixels Pm may be arranged in various suitable configurations, such as a stripe structure, a mosaic arrangement structure, and a delta arrangement structure.

Figure 7:
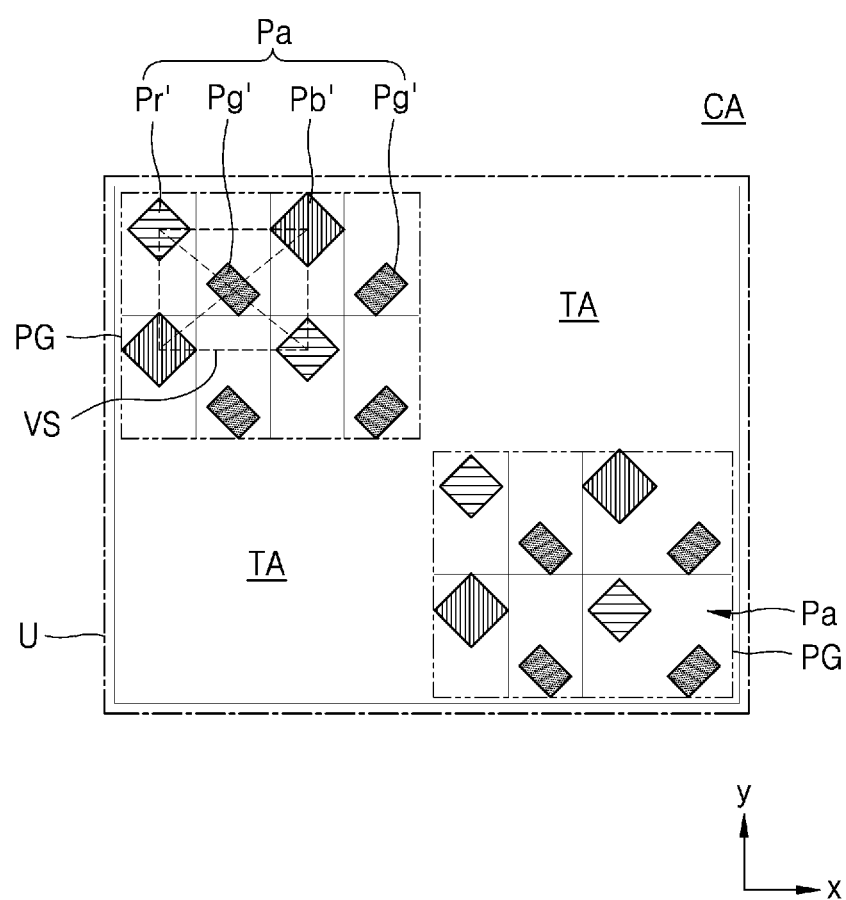
FIGS. 7 and 8 are each a schematic layout view illustrating a pixel arrangement structure in a component area, according to an embodiment.
Figure 8:
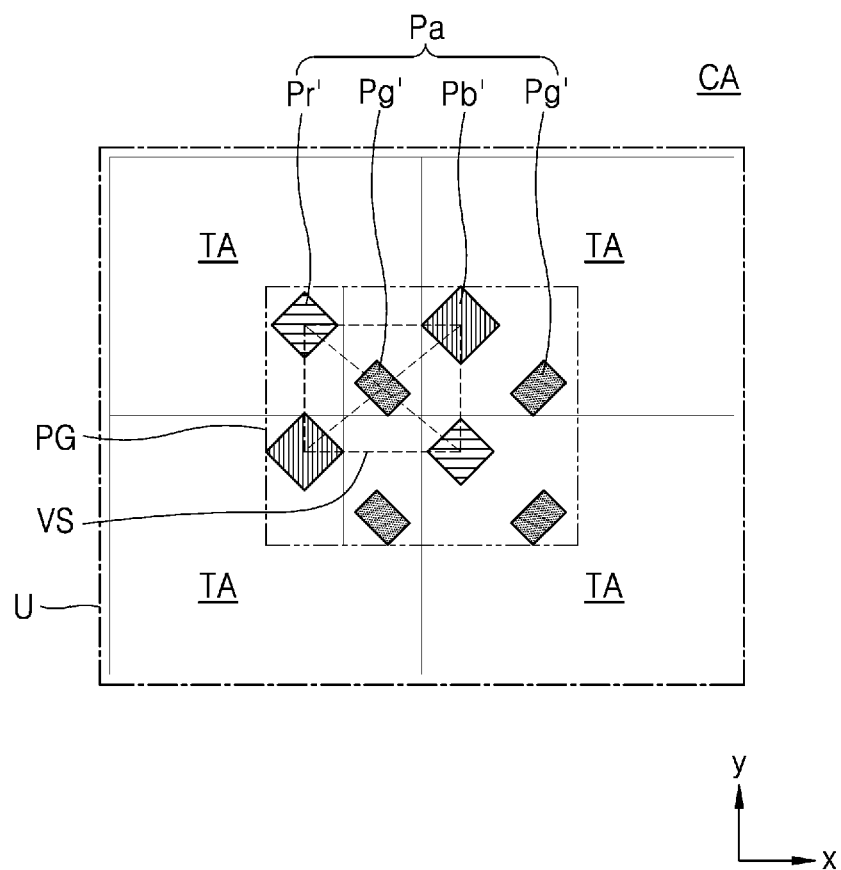

FIGS. 7 and 8 are schematic layout views illustrating pixel arrangement structures in a component area, according to an embodiment.

Referring to FIG. 7, a plurality of auxiliary subpixels Pa may be arranged in the component area CA. The auxiliary subpixels Pa may include first subpixels Pr', second subpixels Pg', and third subpixels Pb', and the first subpixels Pr', the second subpixels Pg', and the third subpixels Pb' may emit light beams (e.g., light) of red, green, and blue colors, respectively.

The component area CA may include a pixel group PG and a transmission area TA, the pixel group PG including at least one auxiliary subpixel Pa. The pixel group PG and the transmission area TA may alternate with each other both in the x-axis direction and the y-axis direction (e.g., may be alternately arranged with each other in each of the x-axis direction and the y-axis direction), and may be arranged with each other in, for example, a lattice configuration. In this case, the component area CA may have a plurality of pixel groups PG and a plurality of transmission areas TA.

The pixel group PG may be defined as a subpixel set in which a plurality of auxiliary subpixels Pa are grouped in a set or predetermined unit. For example, as shown in FIG. 7, a single pixel group PG may include eight auxiliary subpixels Pa arranged in a PENTILE® structure. For example, a single pixel group PG may include two first subpixels Pr', four second subpixels Pg', and two third subpixels Pb'.

In the component area CA, a basic unit U including a certain number of pixel groups PG and a certain number of transmission areas TA may be repeated in each of the x-axis direction and the y-axis direction. In FIG. 7, the basic unit U may have a quadrilateral shape in which two pixel groups PG and two transmission areas TA arranged around the pixel groups PG are grouped. The basic unit U is a repetitive structure and does not indicate a disconnected configuration.

In the main display area MDA, a corresponding unit U' having the same area as that of the basic unit U may be set. In this case, the number of main subpixels Pm included in the corresponding unit U' may be greater than that of auxiliary subpixels Pa included in the basic unit U. For example, the number of auxiliary subpixels Pa included in the basic unit U may be 16 and the number of main subpixels Pm included in the corresponding unit U' may be 32, and thus the number of auxiliary subpixels Pa and the number of main subpixels Pm arranged on equal areas may be in a ratio of 1:2.

A pixel arrangement structure of the component area CA, in which the auxiliary subpixels Pa are arranged in a PENTILE® structure as shown in FIG. 7 and in which a resolution is ½ of the resolution of the main display area MDA is referred to as a ½ PENTILE® structure. The number of auxiliary subpixels Pa included in the pixel group PG or an arrangement method thereof may be modified according to the resolution of the component area CA.

Referring to FIG. 8, the pixel arrangement structure of the component area CA may be a ¼ PENTILE® structure. According to an embodiment, the pixel group PG includes eight auxiliary subpixels Pa arranged in a PENTILE® structure, but a basic unit U may include only one pixel group PG. The remaining area of the basic unit U not occupied by the one pixel group PG may be filled with (e.g., may correspond to the) transmission areas TA. Accordingly, the number of auxiliary subpixels Pa and the number of main subpixels Pm arranged on equal areas may be in a ratio of 1:4. In this case, the one pixel group PG may be surrounded by the transmission areas TA. In some embodiments, the transmission areas TA may be around (e.g., may surround) the one pixel group PG.

Although the plurality of auxiliary subpixels Pa are arranged in a PENTILE® matrix structure in FIGS. 7 and 8, embodiments are not limited thereto. For example, the plurality of auxiliary subpixels Pa may be arranged in various suitable configurations, such as a stripe structure, a mosaic arrangement structure, and a delta arrangement structure.

Although the size of each auxiliary subpixel Pa may be equal to that of each corresponding main subpixels Pm (e.g., the planar area of the first subpixel Pr may be the same as the planar area of the first subpixel Pr', the planar area of the second subpixel Pg may be the same as the planar area of the second subpixel Pg', and the planar area of the third subpixel Pb may be equal to the planar area of the third subpixel Pb') in FIGS. 7 and 8, embodiments are not limited thereto. The size of each auxiliary subpixel Pa may be greater than that of each main subpixel Pm representing the same color as the auxiliary subpixel Pa. For example, a size of the third subpixel Pb' of each auxiliary subpixel Pa may be greater than a size of the third subpixel Pb of each main subpixel Pm. The size difference may be designed by taking into account a difference between brightnesses and/or resolutions of the component area CA and the main display area MDA.

Figure 9:
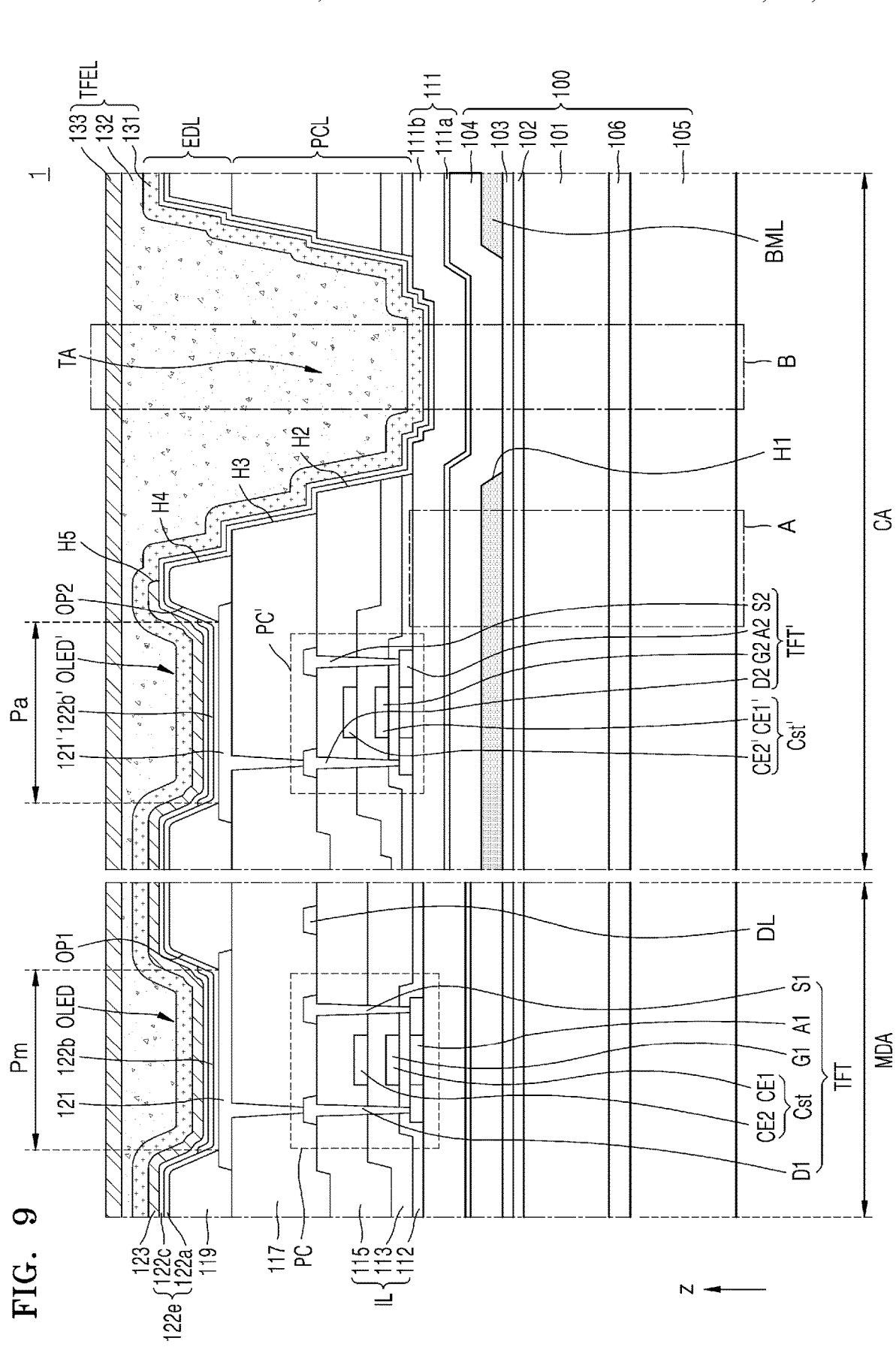
FIG. 9 is a schematic cross-sectional view of a portion of a display panel according to an embodiment, that is, a schematic cross-sectional view of a main display area and a component area.

FIG. 9 is a schematic cross-sectional view of a portion of a display panel according to an embodiment, that is, a schematic cross-sectional view of the main display area MDA and the component area CA.

Referring to FIG. 9, the display apparatus 1 may include the main display area MDA and the component area CA. The component area CA may have a transmission area TA. A main subpixel Pm may be arranged in the main display area MDA, and an auxiliary subpixel Pa may be arranged in the component area CA.

A main pixel circuit PC including a main thin-film transistor TFT and a main storage capacitor Cst, and a main organic light-emitting diode OLED as a display element coupled (e.g., connected) to the main pixel circuit PC may be arranged in the main display area MDA. An auxiliary pixel circuit PC' including an auxiliary thin-film transistor TFT' and an auxiliary storage capacitor Cst', and an auxiliary organic light-emitting diode OLED' as a display element coupled (e.g., connected) to the auxiliary pixel circuit PC' may be arranged in the component area CA.

According to an embodiment, an organic light-emitting diode is employed as a display element. However, the present disclosure is not limited thereto. According to another embodiment, an inorganic light-emitting diode and/or a quantum dot light-emitting diode may be employed as a display element.

A structure in which the components included in the display apparatus 1 are stacked will now be described. The display apparatus 1 may be a stack of a substrate 100, a buffer layer 111, a circuit layer PCL, a display element layer EDL, and a thin-film encapsulation layer TFEL.

The substrate 100 may include a first base layer 101, a compensation layer 102, a first barrier layer 103, and a second barrier layer 104 sequentially stacked on one another. The substrate 100 may further include a second base layer 105 and a third barrier layer 106 arranged below the first base layer 101. For example, the third barrier layer 106 may be under the first base layer 101, and the second base layer 105 may be under the third barrier layer 106.

In the component area CA, a bottom metal layer BML may be between the first barrier layer 103 and the second barrier layer 104. The bottom metal layer BML may be located below the auxiliary pixel circuit PC' and may prevent, reduce, or minimize degradation of characteristics of the auxiliary thin-film transistor TFT' due to light emitted from, for example, the component 40 of FIG. 2. The bottom metal layer BML may prevent, reduce, or minimize diffraction of light emitted from the component 40 and/or the like, or of light heading toward the component 40, through a narrow gap between wires coupled (e.g., connected) to the auxiliary pixel circuit PC'. The bottom metal layer BML may not exist in the transmission area TA. For example, in some embodiments, the bottom metal layer BML may have a first hole H1 corresponding to (e.g., overlapping) the transmission area TA.

A bias voltage may be applied to the bottom metal layer BML. Due to the bottom metal layer BML receiving the bias voltage, the probability that electrostatic discharge occurs may be significantly reduced. The bottom metal layer BML may include (e.g., be) aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a single layer or multi-layer including (e.g., being) the aforementioned materials.

In some embodiments, the bottom metal layer BML of the component area CA may correspond to (e.g., overlap with) substantially the entire component area CA. However, the bottom metal layer BML may have the first hole H1 overlapped by the transmission area TA. According to an embodiment, the shape and size of the transmission area TA may be defined by the shape and size of the first hole H1 defined in the bottom metal layer BML.

The buffer layer 111 may be positioned on the substrate 100 and may reduce or prevent infiltration of a foreign material, moisture, and/or ambient air from below the substrate 100 and may provide a flat surface on the substrate 100. The buffer layer 111 may include (e.g., be) an inorganic material (such as oxide and/or nitride), an organic material, and/or an organic and inorganic compound, and may be a single layer or multiple layers of an inorganic material and an organic material. For example, the buffer layer 111 may include a first buffer layer 111a and a second buffer layer 111b.

The circuit layer PCL may be on the buffer layer 111, and may include the main and auxiliary pixel circuits PC and PC', a first insulating layer 112, a second insulating layer 113, a third insulating layer 115, and a planarization layer 117. The main pixel circuit PC may include the main thin-film transistor TFT and the main storage capacitor Cst, and the auxiliary pixel circuit PC' may include the auxiliary thin-film transistor TFT' and the auxiliary storage capacitor Cst'.

The main thin-film transistor TFT and the auxiliary thin-film transistor TFT' may be above the buffer layer 111. The main thin-film transistor TFT may include a first semiconductor layer A1, a first gate electrode G1, a first source electrode S1, and a first drain electrode D1, and the auxiliary thin-film transistor TFT' may include a second semiconductor layer A2, a second gate electrode G2, a second source electrode S2, and a second drain electrode D2. The main thin-film transistor TFT may be coupled (e.g., connected) to the main organic light-emitting diode OLED and may be to drive the main organic light-emitting diode OLED. The auxiliary thin-film transistor TFT' may be coupled (e.g., connected) to the auxiliary organic light-emitting diode OLED' and may be to drive the auxiliary organic light-emitting diode OLED'.

According to an embodiment, the first semiconductor layer A1 and the second semiconductor layer A2 may be on the buffer layer 111 and may each include (e.g., be) polysilicon. According to an embodiment, the first semiconductor layer A1 and the second semiconductor layer A2 may each include (e.g., be) amorphous silicon. According to an embodiment, the first and second semiconductor layers A1 and A2 may each include (e.g., be) oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). Each of the first and second semiconductor layers A1 and A2 may include a channel region, and a source region and a drain region doped with impurities. For example, the channel region may be between the source region and the drain region for each of the first and second semiconductor layers A1 and A2.

The second semiconductor layer A2 may at least partially overlap the bottom metal layer BML arranged therebelow. According to an embodiment, a width of the second semiconductor layer A2 may be less than a width of the bottom metal layer BML. Accordingly, when projection is performed in a direction approximately or substantially normal or perpendicular to the substrate 100, the second semiconductor layer A2 may entirely overlap the bottom metal layer BML. For example, in the plan view, the second semiconductor layer A2 may entirely overlap the bottom metal layer BML.

The first insulating layer 112 may cover the first and second semiconductor layers A1 and A2. The first insulating layer 112 may include (e.g., be) at least one inorganic insulating material such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first insulating layer 112 may be a single layer or multi-layer including (e.g., being) one or more selected from the aforementioned inorganic insulating materials.

The first gate electrode G1 and the second gate electrode G2 may be arranged above the first insulating layer 112 to overlap the first semiconductor layer A1 (e.g., the channel region of the first semiconductor layer A1) and the second semiconductor layer A2 (e.g., the channel region of the second semiconductor layer A2), respectively. The first and second gate electrodes G1 and G2 may each include (e.g., be) molybdenum (Mo), aluminum (Al), copper (Cu), and/or titanium (Ti), and may each be a single layer or multiple layers (a multi-layer). For example, the first and second gate electrodes G1 and G2 may each be a single layer of Mo.

The second insulating layer 113 may cover the first gate electrode G1 and the second gate electrode G2. The second insulating layer 113 may include (e.g., be) at least one inorganic insulating material such as silicon oxide ($SiO_x$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second insulating layer 113 may be a single layer or multi-layer including (e.g., being) one or more selected from the aforementioned inorganic insulating materials.

A first upper electrode CE2 of the main storage capacitor Cst and a second upper electrode CE2' of the auxiliary storage capacitor Cst' may be above the second insulating layer 113.

In the main display area MDA, the first upper electrode CE2 may overlap the first gate electrode G1 arranged therebelow. The first gate electrode G1 and the first upper electrode CE2 overlapping each other with the second insulating layer 113 therebetween may constitute the main storage capacitor Cst. According to an embodiment, the first gate electrode G1 may be a first lower electrode CE1 of the main storage capacitor Cst. However, the present disclosure is not limited thereto. According to an embodiment, the first lower electrode CE1 of the main storage capacitor Cst may be included as a separate independent component. For example, the first gate electrode G1 may be a separate component from the first lower electrode CE1.

In the component area CA, the second upper electrode CE2' may overlap the second gate electrode G2 arranged therebelow. The second gate electrode G2 and the second upper electrode CE2' overlapping each other with the second insulating layer 113 therebetween may constitute the auxiliary storage capacitor Cst'. According to an embodiment, the second gate electrode G2 may be a second lower electrode CE1' of the auxiliary storage capacitor Cst'. However, the present disclosure is not limited thereto. According to an embodiment, the second lower electrode CE1' of the auxiliary storage capacitor Cst' may be included as a separate independent component. For example, the second gate electrode G2 may be a separate component from the second lower electrode CE1'.

The first and second upper electrodes CE2 and CE2' may each include (e.g., be) aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may each be a single layer or multi-layer including (e.g., being) one or more selected from the aforementioned materials.

The third insulating layer 115 may cover the first upper electrode CE2 and the second upper electrode CE2'. The third insulating layer 115 may include (e.g., be) at least one inorganic insulating material such as silicon oxide ($SiO_x$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). The third insulating layer 115 may be a single layer or multi-layer including (e.g., being) one or more selected from the aforementioned inorganic insulating material.

When the first insulating layer 112, the second insulating layer 113, and the third insulating layer 115 are collectively referred to as an inorganic insulating layer IL, the inorganic insulating layer IL may have a second hole H2 corresponding to (e.g., overlapping) the transmission area TA. The second hole H2 may expose a portion of the upper surface of the buffer layer 111 or the substrate 100. The second hole H2 may be a result of overlapping an opening of the first insulating layer 112, an opening of the second insulating layer 113, and an opening of the third insulating layer 115, which correspond to the transmission area TA. For example, the second hole H2 may include the opening of the first insulating layer 112, the opening of the second insulating layer 113, and the opening of the third insulating layer 115, each of which may overlap each other. For example, in some embodiments, the side walls of the first insulating layer 112, the second insulating layer 113, and the third insulating layer 115 that respectively form the openings of the first insulating layer 112, the second insulating layer 113, and the third insulating layer 115 may be aligned or may form one or more step shapes. These openings may be individually formed through separate processes, or may be simultaneously or concurrently formed through the same process. In some embodiments, when these openings are formed through separate processes, the inner surface of the second hole H2 is not be smooth and has one or more steps such as a staircase shape.

A data line DL, the first and second source electrodes S1 and S2, and the first and second drain electrodes D1 and D2 may be on the third insulating layer 115. Each of the data line DL, the first and second source electrodes S1 and S2, and the first and second drain electrodes D1 and D2 may include (e.g., be) a conductive material including (e.g., being) Mo, Al, Cu, and/or Ti, and may be a multi-layer or single layer including (e.g., being) one or more selected from the aforementioned materials. For example, each of the data line DL, the first and second source electrodes S1 and S2, and the first and second drain electrodes D1 and D2 may be formed as a multi-layer of Ti/Al/Ti.

The planarization layer 117 may cover the data line DL, the first and second source electrodes S1 and S2, and the first and second drain electrodes D1 and D2. The planarization layer 117 may have a flat upper surface such that a first pixel electrode 121 and a second pixel electrode 121' that are located thereon are formed flat (e.g., formed on a flat surface).

The planarization layer 117 may include (e.g., be) an organic material and/or an inorganic material and may have a single layer structure or a multi-layer structure. The planarization layer 117 may include (e.g., be) a polymer (e.g., a commercial polymer) such as benzocyclobutene (BCB), polyimide, hexamethyldisiloxane (HMDSO), polymethyl methacrylate (PMMA) and/or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or the like. The planarization layer 117 may include (e.g., be) at least one inorganic insulating material such as silicon oxide ($SiO_x$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). When the planarization layer 117 is formed, a layer may be formed, and then chemical and/or mechanical polishing may be performed on the upper surface of the layer to provide a flat upper surface.

The planarization layer 117 may have a third hole H3 to correspond to the transmission area TA. The third hole H3 may overlap the second hole H2. FIG. 9 illustrates that the third hole H3 is larger than (e.g., has a larger planar area than) the second hole H2. However, the present disclosure is not limited thereto. According to an embodiment, the planarization layer 117 may cover an edge of the second hole H2 of the inorganic insulating layer IL, and the third hole H3 may have a smaller area (e.g., planar area) than the area (e.g., planar area) of the second hole H2.

The planarization layer 117 may have a via hole via which one selected from the first source electrode S1 and the first drain electrode D1 of the main thin-film-transistor TFT is exposed, and the first pixel electrode 121 may contact the first source electrode S1 or the first drain electrode D1 exposed by the via hole via the via hole and may be electrically coupled (e.g., connected) to the main thin-film-transistor TFT (e.g., through the via hole). The planarization layer 117 may include another opening via which one selected from the second source electrode S2 and the second drain electrode D2 of the auxiliary thin-film transistor TFT' is exposed, and the second pixel electrode 121' may contact the second source electrode S2 or the second drain electrode D2 exposed by the other opening via the other opening and may be electrically coupled (e.g., connected) to the auxiliary thin-film transistor TFT' (e.g., through the other opening).

In FIG. 9, one planarization layer is included. However, the present disclosure is not limited thereto. According to an embodiment, two planarization layers may be included. The inclusion of two planarization layers may be more favorable in one or more aspects to high integration.

The first pixel electrode 121 and the second pixel electrode 121' may be on the planarization layer 117. The first and second pixel electrodes 121 and 121' may include (e.g., be) conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). Each of the first and second pixel electrodes 121 and 121' may include a reflection layer including (e.g., being), for example, silver (Ag), magnesium (Mg), aluminum (Al), platinum (Pt), palladium (Pd), gold (Au), nickel (Ni), neodymium (Nd), iridium (Ir), chromium (Cr), or a compound of these materials. In some embodiments, each of the first and second pixel electrodes 121 and 121' may have a structure including films including (e.g., being) ITO, IZO, ZnO, and/or $In_2O_3$ above and/or below the aforementioned reflection layer. In this case, each of the first and second pixel electrodes 121 and 121' may have a stack structure of ITO/Ag/ITO.

The pixel defining layer 119 may be located on the planarization layer 117. The pixel defining layer 119 may be on the planarization layer 117, and may cover an edge of the first pixel electrode 121. A first opening OP1 exposing at least a portion of the first pixel electrode 121 may be defined in the pixel defining layer 119. The pixel defining layer 119 may be on the planarization layer 117, and may cover an edge of the second pixel electrode 121'. A second opening OP2 exposing at least a portion of the second pixel electrode 121' may be defined in the pixel defining layer 119.

The first opening OP1 and the second opening OP2 may respectively define the sizes and shapes of the light-emission areas of the main and auxiliary organic light-emitting diodes OLED and OLED', namely, the main and auxiliary subpixels Pm and Pa.

The pixel defining layer 119 may prevent an electric arc and/or the like from occurring, or may suppress the formation of such an electric arc and/or the like, on the edges of the first and second pixel electrodes 121 and 121' by increasing distances between the edges of the first and second pixel electrodes 121 and 121' and portions of an opposite electrode 123 above the first and second pixel electrodes 121 and 121'. The pixel defining layer 119 may be formed of an organic insulating material, such as polyimide, acryl resin, benzocyclobutene, hexamethyldisiloxane (HMDSO), and/or phenol resin, for example, via spin coating and/or the like.

A spacer for preventing or reducing damage by a mask may be further arranged on the pixel defining layer 119. The spacer may be integrally formed with the pixel defining layer 119. For example, the spacer and the pixel defining layer 119 may be simultaneously or concurrently formed according to the same process by utilizing (e.g., using) a half tone mask process. In some embodiments, the spacer and the pixel defining layer 119 may include (e.g., be) the same material.

The pixel defining layer 119 may have a fourth hole H4 corresponding to the transmission area TA. The fourth hole H4 may overlap the second hole H2 and the third hole H3. Due to the second through fourth holes H2 through H4, the light transmittance in the transmission area TA may improve. Although the buffer layer 111 continuously extends to correspond to the transmission area TA in FIG. 9, the present disclosure is not limited thereto. In some embodiments, the buffer layer 111 may have a hole located in the transmission area TA, and the hole in the buffer layer 111 may overlap the second through fourth holes H2 through H4. A portion of the opposite electrode 123 to be described later may be arranged on the inner surfaces of the second through fourth holes H2 through H4.

A first emission layer 122b and a second emission layer 122b' may be arranged within the first opening OP1 and the second opening OP2 of the pixel defining layer 119, respectively, to correspond to the first pixel electrode 121 and the second pixel electrode 121', respectively. The first emission layer 122b and the second emission layer 122b' may include (e.g., be) a high molecular weight material and/or a low molecular weight material, and may emit red, green, blue, and/or white light.

According to an embodiment, an organic functional layer 122e may be above and/or below each of the first emission layer 122b and the second emission layer 122b'. The organic functional layer 122e may include a first functional layer 122a and/or a second functional layer 122c. According to an embodiment, the first functional layer 122a or the second functional layer 122c may be omitted.

The first functional layer 122a may be below each of the first emission layer 122b and the second emission layer 122b'. The first functional layer 122a may be a single layer or multiple layers including (e.g., being) an organic material. The first functional layer 122a may be a hole transport layer (HTL) that is a single layer. In some embodiments, the first functional layer 122a may include a hole injection layer (HIL) and/or an HTL. The first functional layer 122a may be integrally provided to correspond to the main and auxiliary organic light-emitting diodes OLED and OLED' included in the main display area MDA and the component area CA.

The second functional layer 122c may be above each of the first emission layer 122b and the second emission layer 122b'. The second functional layer 122c may be a single layer or multiple layers including (e.g., being) an organic material. The second functional layer 122c may include an electron transport layer (ETL) and/or an electron injection layer (EIL). The second functional layer 122c may be integrally provided to correspond to the main and auxiliary organic light-emitting diodes OLED and OLED' included in the main display area MDA and the component area CA.

The opposite electrode 123 may be on the second functional layer 122c. The opposite electrode 123 may include (e.g., be) a conductive material having a low work function. For example, the opposite electrode 123 may include a (semi)transparent layer including (e.g., being), for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. In some embodiments, the opposite electrode 123 may further include a layer, such as ITO, IZO, ZnO, and/or $In_2O_3$, on the (semi)transparent layer including (e.g., being) any of the above-described materials. The opposite electrode 123 may be integrally provided to correspond to the main and auxiliary organic light-emitting diodes OLED and OLED' included in the main display area MDA and the component area CA.

The layers (e.g., portions of the layers) ranging from the first pixel electrode 121 to the opposite electrode 123 (e.g., the first pixel electrode 121, the opposite electrode 123, and the layers therebetween) arranged in the main display area MDA may constitute the main organic light-emitting diode OLED. The layers (e.g., portions of the layers) ranging from the second pixel electrode 121' to the opposite electrode 123 (e.g., the second pixel electrode 121', the opposite electrode 123, and the layers therebetween) arranged in the component area CA may constitute the auxiliary organic light-emitting diode OLED'.

A capping layer including (e.g., being) an organic material may be on the opposite electrode 123. The capping layer may be provided to protect the opposite electrode 123 and also to increase light extraction efficiency. The capping layer may include (e.g., be) an organic material having a higher refractive index (index of refraction) than that of the opposite electrode 123.

The opposite electrode 123 may have a fifth hole H5 corresponding to the transmission area TA. The fifth hole H5 corresponding to the transmission area TA may be understood as the fifth hole H5 overlapping the transmission area TA. In some embodiments, the fifth hole H5 may overlap each of the second through fourth holes H2 through H4. In FIG. 9, the area (e.g., breadth, diameter, and/or planar area) of the fifth hole H5 is wider than that of the second hole H2 formed in the inorganic insulating layer IL. However, embodiments are not limited thereto. In some embodiments, the area of the fifth hole H5 may be smaller than or equal to that of the second hole H2.

A portion of the opposite electrode 123 does not exist in the transmission area TA due to the fifth hole H5, and thus the light transmittance in the transmission area TA may significantly increase. The opposite electrode 123 including the fifth hole H5 may be formed utilizing (e.g., using) various suitable methods. According to an embodiment, after a material used to form the opposite electrode 123 is deposited on the entire surface of the substrate 100, a portion of the deposited material that corresponds to the transmission area TA may be removed via laser lift off, and thus the opposite electrode 123 having the fifth hole H5 may be formed. According to an embodiment, the opposite electrode 123 having the fifth hole H5 may be formed by metal self patterning (MSP). According to another embodiment, the opposite electrode 123 having the fifth hole H5 may be formed via a deposition method utilizing (e.g., using) a fine metal mask (FMM).

The thin-film encapsulation layer TFEL may be arranged as an encapsulation member, above the display element layer EDL of the display apparatus 1. For example, the main organic light-emitting diode OLED and the auxiliary organic light-emitting diode OLED' may be sealed by the thin-film encapsulation layer TFEL. The thin-film encapsulation layer TFEL may be on the opposite electrode 123. The thin-film encapsulation layer TFEL may prevent or block infiltration of external moisture and/or foreign materials into the main organic light-emitting diode OLED and the auxiliary organic light-emitting diode OLED'.

The thin-film encapsulation layer TFEL may include at least one inorganic encapsulation layer and at least one organic encapsulation layer. With regard to this, FIG. 5 illustrates that the thin-film encapsulation layer TFEL is a stack of the first inorganic encapsulation layer 131, the organic encapsulation layer 132, and the second inorganic encapsulation layer 133. According to an embodiment, the number of organic encapsulation layers, the number of inorganic encapsulation layers, and the order in which organic encapsulation layers and inorganic encapsulation layers are stacked may be suitably modified.

The first and second inorganic encapsulation layers 131 and 133 may each include (e.g., be) at least one inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$), and may, for example, be formed by chemical vapor deposition (CVD) and/or the like. The organic encapsulation layer 132 may include (e.g., be) a polymer-based material. Examples of the polymer-based material may include a silicon-based resin, an acryl-based resin, an epoxy-based resin, polyimide, and/or polyethylene.

The first inorganic encapsulation layer 131, the organic encapsulation layer 132, and the second inorganic encapsulation layer 133 may each be integrally provided to cover the main display area MDA and the component area CA. Accordingly, the first inorganic encapsulation layer 131, the organic encapsulation layer 132, and the second inorganic encapsulation layer 133 may each be arranged within the second hole H2 of the inorganic insulating layer IL.

Figure 10:
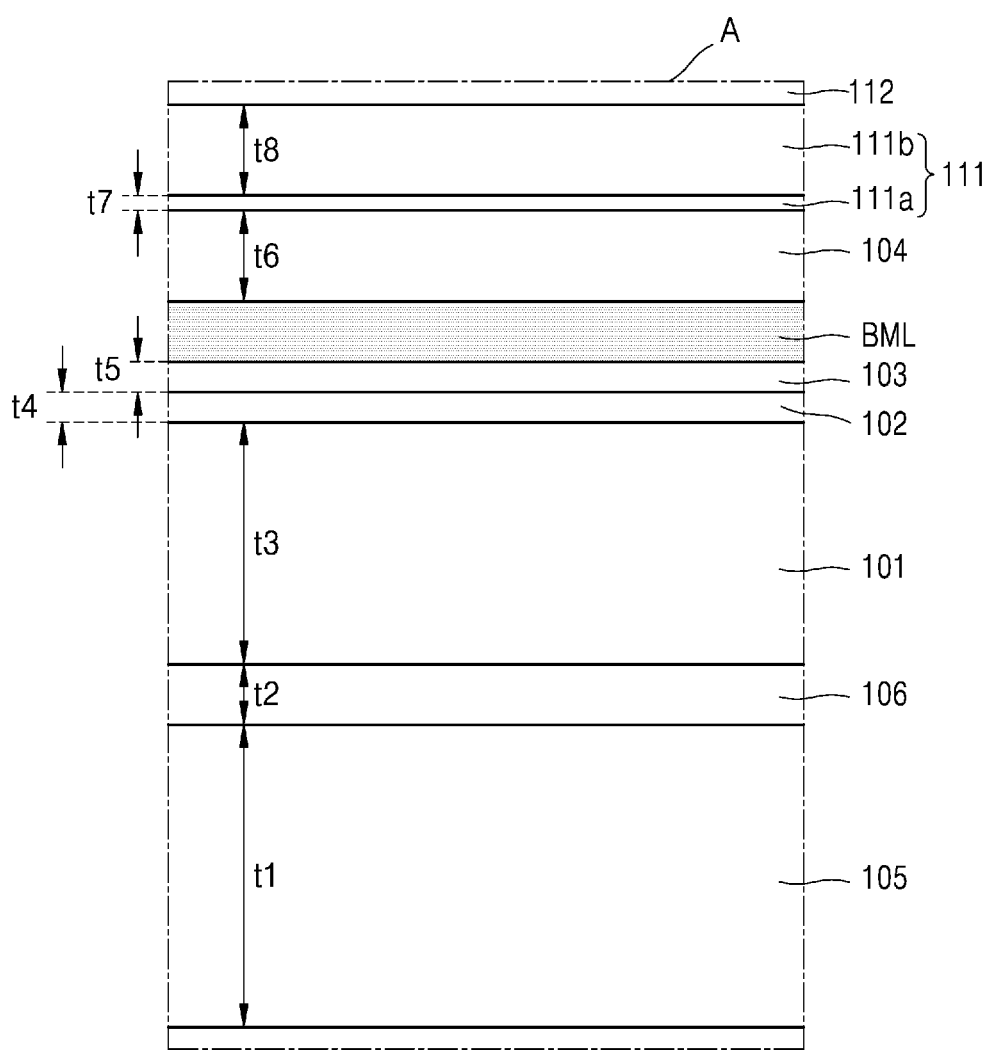
FIG. 10 is a magnified view of portion A of FIG. 9, according to an embodiment.
Figure 11:
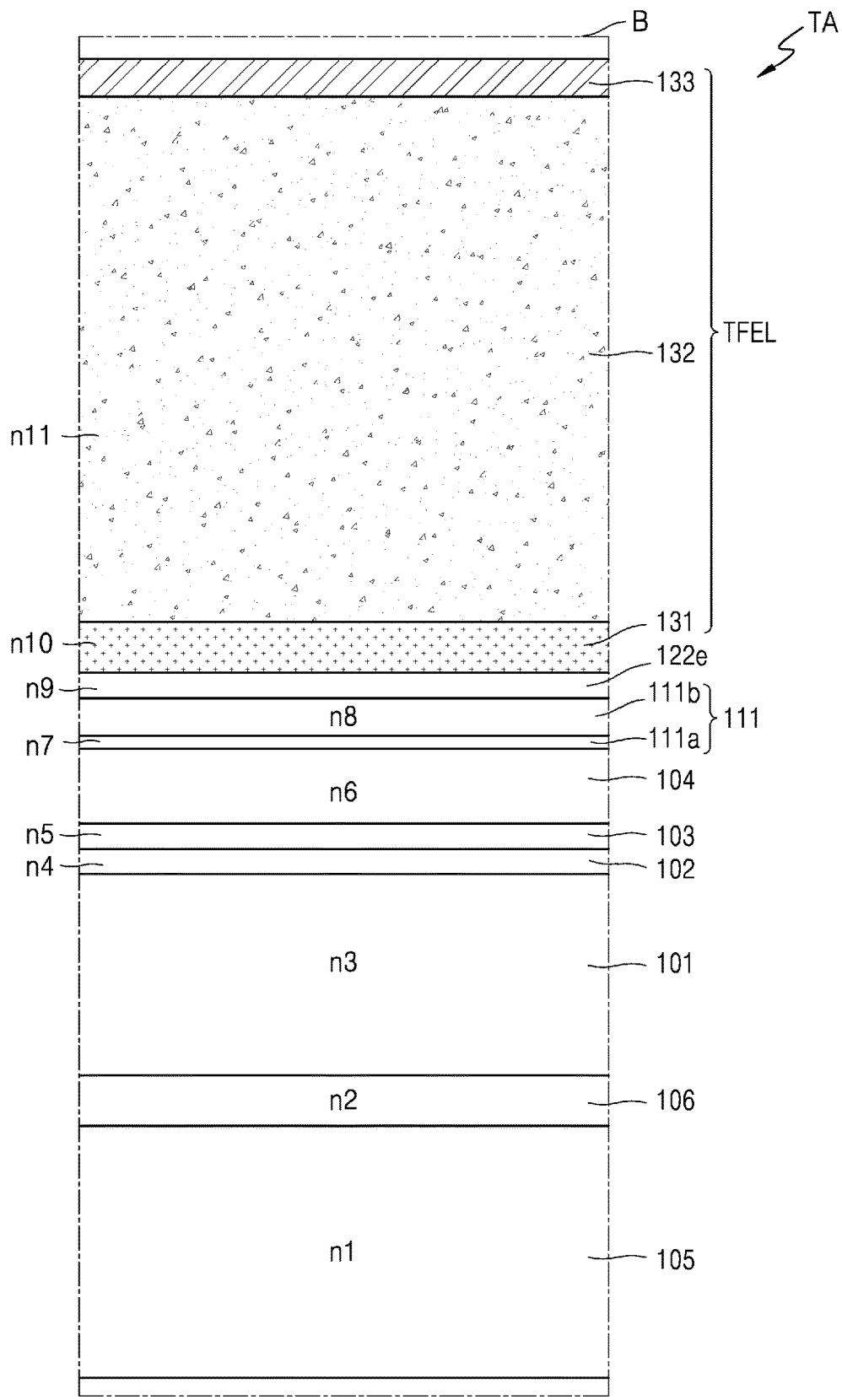
FIG. 11 is a magnified view of portion B of FIG. 9, according to an embodiment.

FIG. 10 is a magnified view of portion A of FIG. 9 according to an embodiment, and FIG. 11 is a magnified view of portion B of FIG. 9 according to an embodiment.

Referring to FIGS. 10 and 11, the substrate 100 may include the first base layer 101, the compensation layer 102, the first barrier layer 103, and the second barrier layer 104 sequentially stacked on one another. The substrate 100 may further include the second base layer 105 and the third barrier layer 106 arranged below the first base layer 101.

Each of the first and second base layers 101 and 105 may include (e.g., be) polymer resin having high heat resistance. For example, the first and second base layers 101 and 105 may each include (e.g., be) at least one selected from the group consisting of polyethersulfone, polyacrylate, polyetherimide, polyethylene naphthalate, polyethylene terephthalate, polyphenylene sulfide, polyarylate, polyimide, polycarbonate, cellulose triacetate, cellulose acetate propionate, and polyarylene ether sulfone.

For example, polyimide has a high mechanical strength, and has a glass transition temperature of about 450° C. and thus has higher heat-resistance than some other polymer resin. Accordingly, when the first base layer 101 and the second base layer 105 include (e.g., are) polyimide, even when a process of forming the third barrier layer 106 on the second base layer 105 and a process of forming the compensation layer 102, the first barrier layer 103, and the second barrier layer 104 on the first base layer 101 are conducted at high temperature, the first base layer 101 and the second base layer 105 may not sag (e.g., may not be deformed due to the high temperature) and may be stably supported by loads of the third barrier layer 106, the compensation layer 102, and the first barrier layer 103. The first base layer 101 and the second base layer 105 each including (e.g., being) the above-described polymer resin including (e.g., being) polyimide are highly transmissive with respect to oxygen and/or moisture. Accordingly, the third barrier layer 106 and the first barrier layer 103 each blocking penetration of oxygen and/or moisture may be included between the second base layer 105 and the first base layer 101, and on the first base layer 101, respectively.

A thickness t1 of the second base layer 105 may be greater than a thickness t3 of the first base layer 101. Because the second base layer 105 is included to support the components arranged thereon, the second base layer 105 having a higher mechanical strength than the first base layer 101 may be more stable in a manufacturing process of the display apparatus. Accordingly, the thickness t1 of the second base layer 105 may be about 9 μm to 11 μm (e.g., from about 9 μm to about 11 μm), and the thickness t3 of the first base layer 101 may be about 5 μm to 7 μm (e.g., from about 5 μm to about 7 μm).

When the second base layer 105 and the first base layer 101 include (e.g., be) polyimide, a refractive index n1 of the second base layer 105 and a refractive index n3 of the first base layer 101 may each have a value of about 1.9 for light having a wavelength of 550 nm.

The third barrier layer 106 may be between the second base layer 105 and the first base layer 101. The third barrier layer 106 may prevent, reduce, or minimize permeation of impurity elements such as oxygen and/or moisture to above the first base layer 101. According to an embodiment, the third barrier layer 106 may include (e.g., be) an inorganic insulating material such as silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). For example, the third barrier layer 106 may include (e.g., be) silicon oxide ($SiO_X$).

A thickness t2 of the third barrier layer 106 may be 3,000 angstrom (Å) to 6,000 angstrom (Å) (e.g., from about 3,000 angstrom (Å) to about 6,000 angstrom (Å)). When the thickness t2 of the third barrier layer 106 is less than 3,000 angstrom (Å), the blocking rate of moisture and/or oxygen may significantly decrease. When the thickness t2 of the third barrier layer 106 exceeds 6,000 angstrom (Å), a process time period for forming the third barrier layer 106 may increase.

A refractive index n2 of the third barrier layer 106 may have a value of about 1.3 to about 1.6 for light having a wavelength of 550 nm.

The first barrier layer 103 may be on the first base layer 101 (e.g., on the compensation layer 102). The first barrier layer 103 may prevent, reduce, or minimize upward permeation (e.g., permeation towards the buffer layer 111) of impurity elements such as oxygen and/or moisture. According to an embodiment, the first barrier layer 103 may include (e.g., be) an inorganic insulating material such as silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). For example, the first barrier layer 103 may include (e.g., be) silicon oxide ($SiO_X$).

A thickness t5 of the first barrier layer 103 may be 500 angstrom (Å) to 2,000 angstrom (Å). A refractive index n5 of the first barrier layer 103 may have a value of 1.3 to 1.6 for light having a wavelength of 550 nm.

The compensation layer 102 may be between the first base layer 101 and the first barrier layer 103. The compensation layer 102 may be included to improve the light transmittance of the transmission area TA. According to an embodiment, the compensation layer 102 may include (e.g., be) an inorganic insulating material such as silicon nitride ($SiN_X$), aluminum oxide ($Al_2O_3$), titanium oxide ($TiO_2$), tantalum oxide ($Ta_2O_5$), hafnium oxide ($HfO_2$), and/or zinc oxide ($ZnO_2$). In some embodiments, the compensation layer 102 may include (e.g., be) silicon oxynitride ($SiO_XN_Y$) ($x \geq 0$, $y \geq 0$).

A thickness t4 of the compensation layer 102 may be 500 angstrom (Å) to 2,000 angstrom (Å). When the thickness t4 of the compensation layer 102 is less than 500 angstrom (Å), the light transmittance of the transmission area TA may not improve and/or may not be desirable. When the thickness t4 of the compensation layer 102 exceeds 2,000 angstrom (Å), dehydrogenation, in which a nitrogen component included in the compensation layer 102 is combined with the hydrogen elements of the first and second semiconductor layers A1 and A2, is caused, and the characteristics of the first and second semiconductor layers A1 and A2 may be changed.

Because the compensation layer 102 is included to improve the light transmittance of the transmission area TA, a refractive index n4 of the compensation layer 102 may have a value between the refractive index n3 of the first base layer 101 and the refractive index n5 of the first barrier layer 103.

In embodiments where the compensation layer 102 is silicon oxynitride ($SiO_XN_Y$), the refractive index n4 of the silicon oxynitride ($SiO_XN_Y$) that constitutes the compensation layer 102 may be adjusted according to a ratio between oxygen and nitrogen. For example, when the amount of oxygen included in silicon oxynitride ($SiO_XN_Y$) increases (e.g., when the ratio of oxygen to nitrogen in the silicon oxynitride increase), the refractive index n4 of the compensation layer 102 may decrease, and, when the amount of nitrogen included in silicon oxynitride ($SiO_XN_Y$) increases (e.g., when the ratio of nitrogen to oxygen in the silicon oxynitride increases), the refractive index n4 of the compensation layer 102 may increase. Accordingly, the refractive index n4 of the compensation layer 102 may be adjusted between 1.5 and 1.8. According to an embodiment, the refractive index n4 of the compensation layer 102 may be about 1.65 to about 1.75. Because the refractive index of silicon nitride ($SiN_X$) including no oxygen is about 1.9 and is thus similar to the refractive index of polyimide (PI), silicon nitride ($SiN_X$) may not be appropriate for the compensation layer 102.

When the compensation layer 102 is not included and the first base layer 101 and the first barrier layer 103 directly contact each other, light may not be transmitted and may be lost due to a difference between the refractive index n3 of the first base layer 101 and the refractive index n5 of the first barrier layer 103. According to an embodiment, because the refractive index n4 of the compensation layer 102 between the first base layer 101 and the first barrier layer 103 has a value between the refractive index n3 of the first base layer 101 and the refractive index n5 of the first barrier layer 103, the amount of light that is lost may decrease.

According to an embodiment, the compensation layer 102 may be between the second base layer 105 and the third barrier layer 106. In some embodiments, the compensation layer 102 may be between the first base layer 101 and the first barrier layer 103, and another compensation layer (e.g., a compensation layer having a thickness and a composition respectively selected from the thicknesses and compositions that the compensation layer 102 may have, as described above) may be between the second base layer 105 and the third barrier layer 106.

The second barrier layer 104 may be on (e.g., directly on) the first barrier layer 103. According to an embodiment, the second barrier layer 104 may include (e.g., be) an inorganic insulating material such as silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). For example, the second barrier layer 104 may include (e.g., be) the same material as that included in the first barrier layer 103.

A thickness t6 of the second barrier layer 104 may be 2,000 angstrom (Å) to 4,000 angstrom (Å). A refractive index n6 of the second barrier layer 104 may have a value of 1.3 to 1.6 for light having a wavelength of 550 nm.

The buffer layer 111 may be on the second barrier layer 104. The buffer layer 111 may include the first buffer layer 111a and the second buffer layer 111b.

The first buffer layer 111a may be on the second barrier layer 104. For example, the first buffer layer 111a may be directly on the second barrier layer 104. According to an embodiment, the first buffer layer 111a may include (e.g., be) an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). For example, the first buffer layer 111a may include (e.g., be) silicon nitride ($SiN_X$).

A thickness t7 of the first buffer layer 111a may be 80 angstrom (Å) to 250 angstrom (Å). In the process (e.g., manufacturing or fabrication process), it may be difficult to form the thickness t7 of the first buffer layer 111a to less than 80 angstrom (Å). On the other hand, when the thickness t7 of the first buffer layer 111a exceeds 250 angstrom (Å), the light transmittance of the transmission area TA may be degraded. In contrast with nitrogen included in a barrier layer and a compensation layer, in some embodiments where the first buffer layer 111a includes (e.g., is) silicon nitride ($SiN_X$), nitrogen of silicon nitride ($SiN_X$) included in the first buffer layer 111a may improve the characteristics of the first and second semiconductor layers A1 and A2 by supplying a suitable amount of hydrogen to the first and second semiconductor layers A1 and A2. Accordingly, the first buffer layer 111a may include (e.g., be) silicon nitride ($SiN_X$), and, considering the light transmittance, the thickness t7 of the first buffer layer 111a may be a thickness of 80 angstrom (Å) to 250 angstrom (Å).

A refractive index n7 of the first buffer layer 111a may have a value of 1.8 to 2 for light having a wavelength of 550 nm.

The second buffer layer 111b may be on the first buffer layer 111a. According to an embodiment, the second buffer layer 111b may include (e.g., be) an inorganic insulating material such as silicon nitride ($SiN_X$), silicon oxynitride $SiO_XN_Y$), aluminum oxide ($Al_2O_3$), titanium oxide ($TiO_2$), tantalum oxide ($Ta_2O_5$), hafnium oxide ($HfO_2$), and/or zinc oxide ($ZnO_2$). For example, the second buffer layer 111b may include (e.g., be) silicon oxide ($SiO_X$).

A thickness t8 of the second buffer layer 111b may be 1,000 angstrom (Å) to 4,000 angstrom (Å). When the thickness t8 of the second buffer layer 111b is less than 1,000 angstrom (Å), it may be difficult for the second buffer layer 111b to play the role of (e.g., to perform its intended function as) a buffer layer, and, when the thickness t8 of the second buffer layer 111b exceeds 4,000 angstrom (Å), a process time period for forming a layer (e.g., the second buffer layer 111b and/or a layer from which the second buffer layer 111b is formed) may increase.

A refractive index n8 of the second buffer layer 111b may have a value of 1.3 to 1.6 for light having a wavelength of 550 nm.

The bottom metal layer BML may be between the substrate 100 of FIG. 9 and the buffer layer 111, and the buffer layer 111 may include the first buffer layer 111a including (e.g., being) silicon nitride ($SiN_X$) and the second buffer layer 111b including (e.g., being) silicon oxide ($SiO_X$). The first buffer layer 111a may have a thickness of about 500 angstrom (Å), and the second buffer layer 111b may have a thickness of about 3,000 angstrom (Å). In some embodiments, the bottom metal layer BML may be between the first barrier layer 103 and the second barrier layer 104. However, when the first buffer layer 111a includes (e.g., is) silicon nitride ($SiN_X$) and the thickness of the first buffer layer 111a including (e.g., being) silicon nitride ($SiN_X$) is reduced from 500 angstrom (Å) to 100 angstrom (Å) in order to improve the light transmittance of the transmission area TA in the above structure, the amount of hydrogen supplied to the first semiconductor layer A1 of the main thin-film transistor TFT is reduced due to the reduction in the thickness of silicon nitride ($SiN_X$), and thus the characteristics of the main thin-film transistor TFT become degraded, but light reflected by the bottom metal layer BML is absorbed by the second semiconductor layer A2 of the auxiliary thin-film transistor TFT', and thus the characteristics of the auxiliary thin-film transistor TFT' may be improved. In other words, the characteristics of the main thin-film transistor TFT become degraded and the characteristics of the auxiliary thin-film transistor TFT' become improved, and thus a difference between the characteristics of the main thin-film transistor TFT and the auxiliary thin-film transistor TFT' are generated. Due to the difference between the characteristics of the main thin-film transistor TFT and the auxiliary thin-film transistor TFT', a difference between brightnesses of the main display area MDA and the component area CA is generated.

According to an embodiment of the present disclosure, the bottom metal layer BML may be between the first barrier layer 103 and the second barrier layer 104. The bottom metal layer BML is arranged between the first barrier layer 103 and the second barrier layer 104, and accordingly the main thin-film transistor TFT and the auxiliary thin-film transistor TFT' have similar lower stack structures. Thus, generation of a difference between the characteristics of the main thin-film transistor TFT and the auxiliary thin-film transistor TFT' may be prevented, reduced, or minimized. Accordingly, generation of a difference between the brightnesses of the main display area MDA and the component area CA may be prevented, reduced, or minimized.

Because the inorganic insulating layer IL of FIG. 9, the planarization layer 117 of FIG. 9, the pixel defining layer 119 of FIG. 9, and the opposite electrode 123 of FIG. 9 are removed from the transmission area TA, the organic functional layer 122e and the thin-film encapsulation layer TFEL may be sequentially stacked on the buffer layer 111 of (e.g., the portion of the buffer layer 111 in) the transmission area TA. For example, the organic functional layer 122e may be on (e.g., directly on) the portion of the buffer layer 111 exposed by the second hole H2, and the thin-film encapsulation layer TFEL may be on (e.g., directly on) the portion of the organic functional layer 122e in the transmission area TA. The thin film encapsulation layer TFEL may include the first inorganic encapsulation layer 131, the organic encapsulation layer 132, and the second inorganic encapsulation layer 133 sequentially stacked on one another.

A refractive index n9 of the organic functional layer 122e on (e.g., in) the transmission area TA may be about 1.9, and a refractive index n11 of the organic encapsulation layer 132 may be about 1.5. A refractive index n10 of the first inorganic encapsulation layer 131 between the organic functional layer 122e and the organic encapsulation layer 132 may have a value between the refractive index n9 of the organic functional layer 122e and the refractive index n11 of the organic encapsulation layer 132. According to an embodiment, when the first inorganic encapsulation layer 131 includes a single layer, the refractive index n10 of the first inorganic encapsulation layer 131 may have a value of 1.55 to 1.7.

Figure 12:
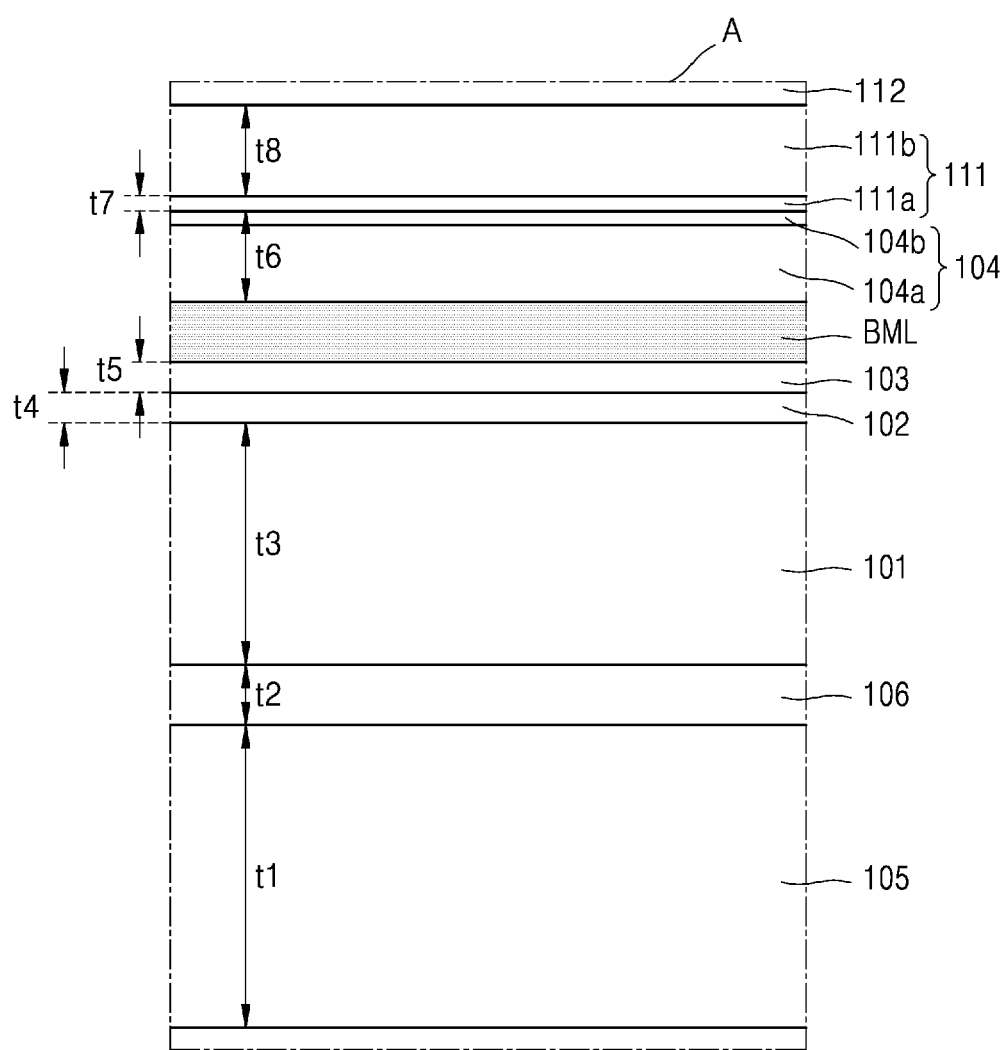
FIG. 12 is a magnified view of portion A of FIG. 9, according to an embodiment.

FIG. 12 is a magnified view of portion A of FIG. 9, according to an embodiment. The embodiment of FIG. 12 is different from that of FIG. 10 in that the second barrier layer 104 includes a first layer 104a and a second layer 104b. The same reference numerals in FIGS. 12 and 10 denote the same elements, and thus repeated descriptions thereof may not be provided.

Referring to FIG. 12, the second barrier layer 104 may be on (e.g., directly on) the first barrier layer 103. The second barrier layer 104 may include the first layer 104a and the second layer 104b sequentially stacked on each other.

According to an embodiment, because plasma including (e.g., being) chlorine ($Cl_2$) gas is radiated to the upper surface of the second barrier layer 104 before depositing the first buffer layer 111a onto the second barrier layer 104, the second barrier layer 104 may be included to have a structure including the first layer 104a and the second layer 104b arranged on the first layer 104a and including a larger amount of chlorine (Cl) than the first layer 104a. According to an embodiment, because the first buffer layer 111a is deposited on the second barrier layer 104 by utilizing (e.g., using) a gas including (e.g., being) chlorine (Cl), for example, dichlorosilic acid ($SiH_2Cl_2$), trichlorosilic acid ($SiHCl_3$), or silicon tetrachloride ($SiCl_4$), the second barrier layer 104 may be included in a structure including the first layer 104a and the second layer 104b arranged on the first layer 104a and including a larger amount of chlorine (Cl) than the first layer 104a.

The amount (e.g., concentration, wt. %, at. %, etc.) of chlorine included in the second layer 104b of the second barrier layer 104 may be greater than that of chlorine included in the first layer 104a. For example, a larger amount of Cl may be included in the second layer 104b than in the first layer 104a.

The inclusion of the second layer 104b including a high Cl content in the second barrier layer 104 may prevent, block, or minimize permeation of hydrogen into above the second barrier layer 104, thereby preventing, reducing, or minimizing a change in the characteristics of the first and second semiconductor layers A1 and A2. In addition, the inclusion of the second layer 104b including a high Cl content in the second barrier layer 104 may help the main thin-film transistor TFT and the auxiliary thin-film transistor TFT' to have target (e.g., desired or excellent) characteristics.

Figure 13:
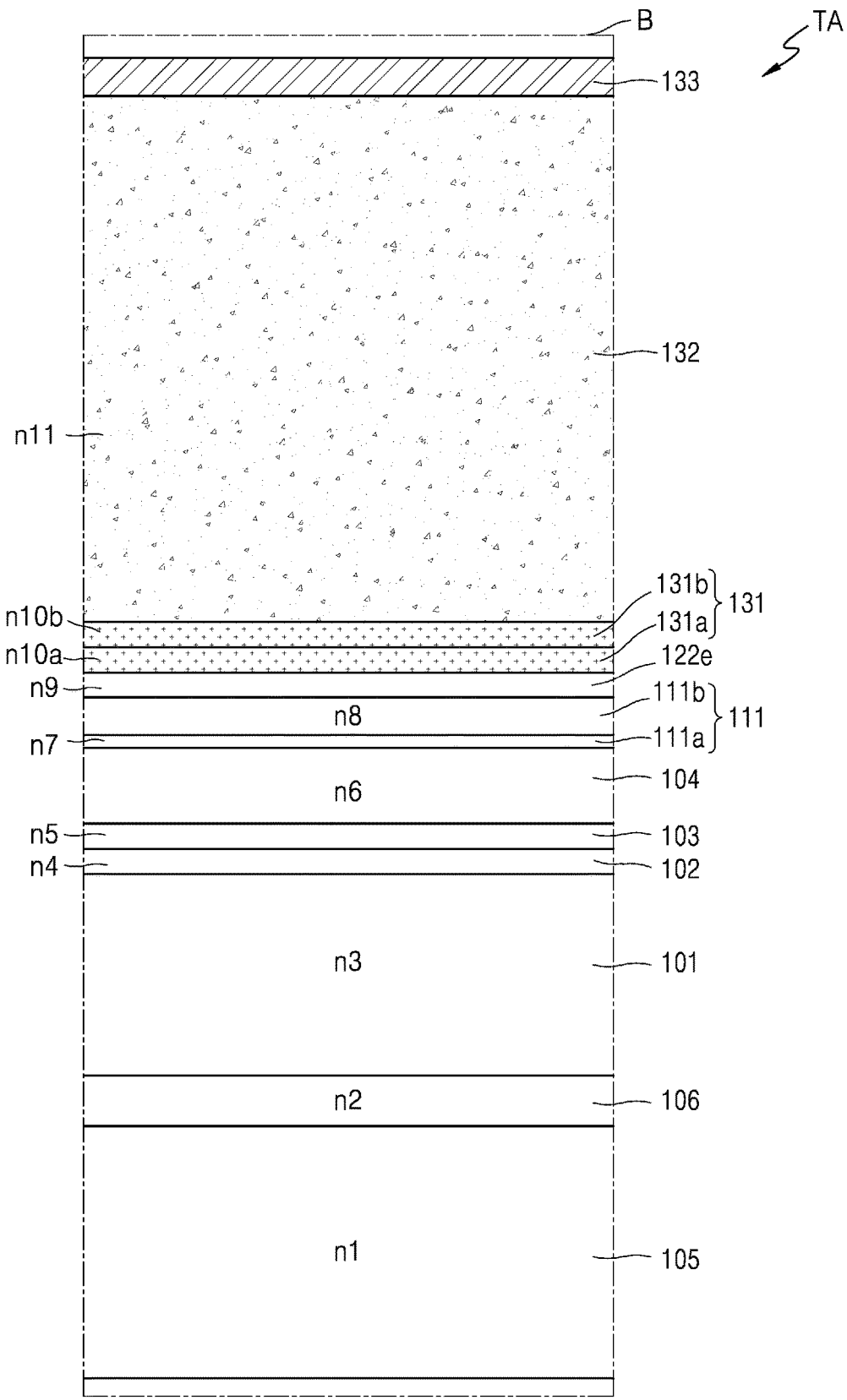
FIG. 13 is a magnified view of portion B of FIG. 9, according to an embodiment.

FIG. 13 is a magnified view of portion B of FIG. 9, according to an embodiment. The embodiment of FIG. 13 is different from that of FIG. 11 in that the first inorganic encapsulation layer 131 includes a complex layer having different refractive indexes. The same reference numerals in FIGS. 13 and 11 denote the same elements, and thus repeated descriptions thereof may not be provided.

Referring to FIG. 13, the first inorganic encapsulation layer 131 of the thin-film encapsulation layer TFEL may include a first refractive index layer 131a and a second refractive index layer 131b stacked on each other, wherein the second refractive index layer 131b is arranged on the first refractive index layer 131a. A refractive index n10a of the first refractive index layer 131a may be greater than a refractive index n10b of the second refractive index layer 131b. According to an embodiment, the first refractive index layer 131a may include (e.g., be) silicon oxynitride $SiO_XN_Y$ ($_X \geq 0$, $_Y \geq 0$), and thus may have a refractive index n10a of about 1.6 to about 1.7. The second refractive index layer 131b may include (e.g., be) silicon oxynitride $SiO_XN_Y$ ($_X \geq 0$, $_Y \geq 0$), and thus may have a refractive index n10b of about 1.5 to about 1.6. According to an embodiment, the refractive index n10a of the first refractive index layer 131a may be smaller than the refractive index n10b of the second refractive index layer 131b.

By adjusting the refractive index of the first inorganic encapsulation layer 131 between the organic functional layer 122e and the organic encapsulation layer 132 in units of layers, a difference in the refractive index on an interface between the layers may be reduced, and thus the light transmittance of the transmission area TA may be improved. When the first inorganic encapsulation layer 131 includes the first refractive index layer 131a and the second refractive index layer 131b, a fluctuation of the light transmittance according to wavelengths may decrease (e.g., uniformity of light transmittance among wavelengths may be improved). A thickness of the first inorganic encapsulation layer 131 may be 1 μm to 2 μm.

FIGS. 14 through 22 are each a schematic cross-sectional view for explaining a method of manufacturing a display apparatus, according to an embodiment.

The method of manufacturing the display device apparatus will now be described with reference to FIGS. 14 through 22.

The method of manufacturing the display device apparatus may include an operation (e.g., task or act) of forming the compensation layer 102 on the first base layer 101, an operation of forming the first barrier layer 103 on the compensation layer 102, an operation of forming the bottom metal layer BML on the first barrier layer 103, an operation of forming the second barrier layer 104 on the bottom metal layer BML, and an operation of forming the buffer layer 111 on the second barrier layer 104.

Figure 14:
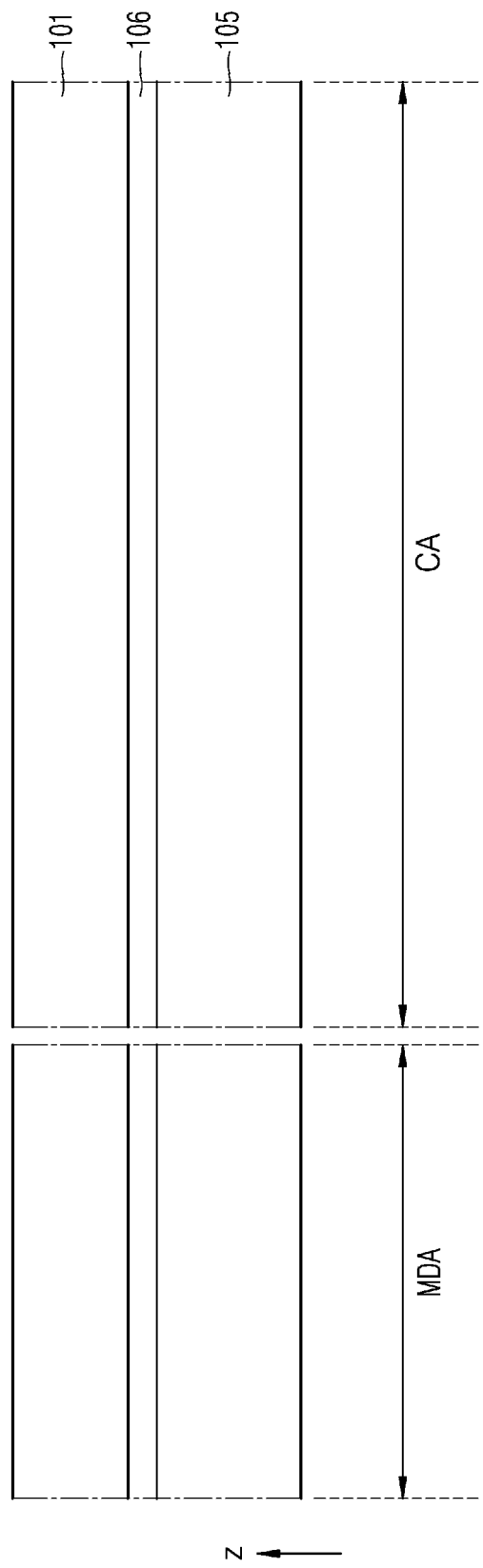
FIGS. 14-22 are schematic cross-sectional views for explaining a method of manufacturing a display apparatus, according to an embodiment.

Referring to FIG. 14, the third barrier layer 106 may be formed on the second base layer 105, and the first base layer 101 may be formed on the third barrier layer 106. Each of the first and second base layers 101 and 105 may include (e.g., be) polyimide. The thickness of the second base layer 105 may be greater than the thickness of the first base layer 101. A refractive index of the second base layer 105 and a refractive index of the first base layer 101 may each have a value of about 1.9 for light having a wavelength of 550 nm.

The third barrier layer 106 may include (e.g., be) silicon oxide ($SiO_X$) and may have a thickness of 3,000 angstrom (Å) to 6,000 angstrom (Å). A refractive index of the third barrier layer 106 may have a value of about 1.3 to about 1.6 for light having a wavelength of 550 nm.

Figure 15:
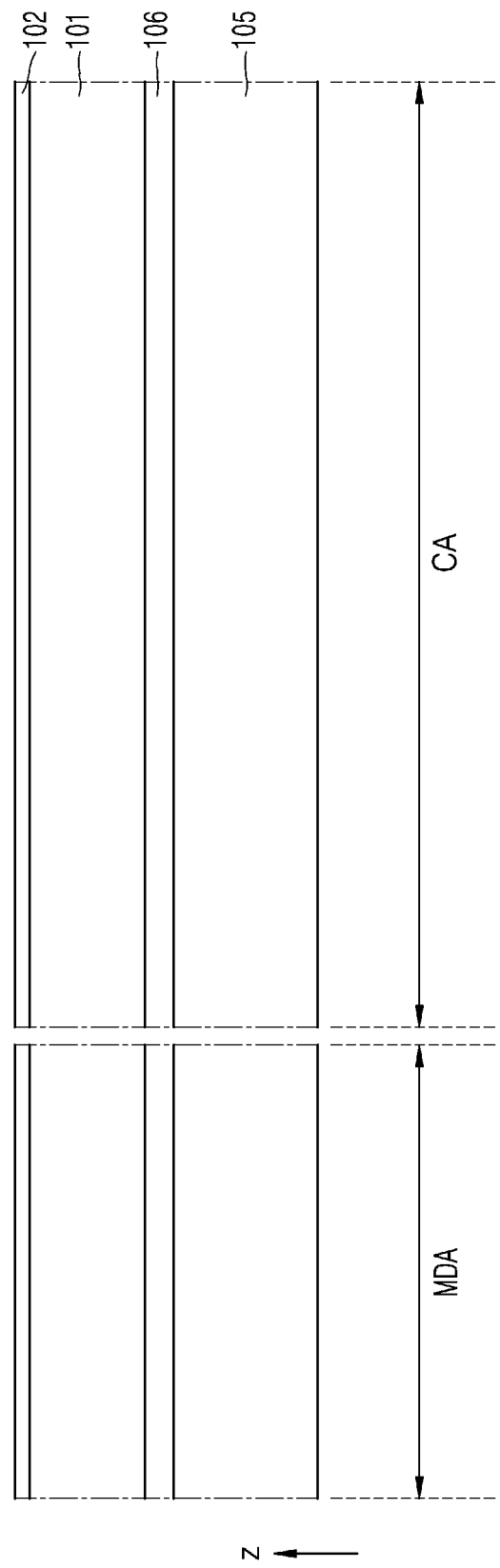

Referring to FIG. 15, the compensation layer 102 may be formed on the first base layer 101. The compensation layer 102 may include (e.g., be) silicon oxynitride ($SiO_XN_Y$) ($_X \geq 0$, $_Y \geq 0$), and may have a thickness of 500 angstrom (Å) to 2,000 angstrom (Å). A refractive index of the compensation layer 102 may be about 1.65 to about 1.75.

Figure 16:
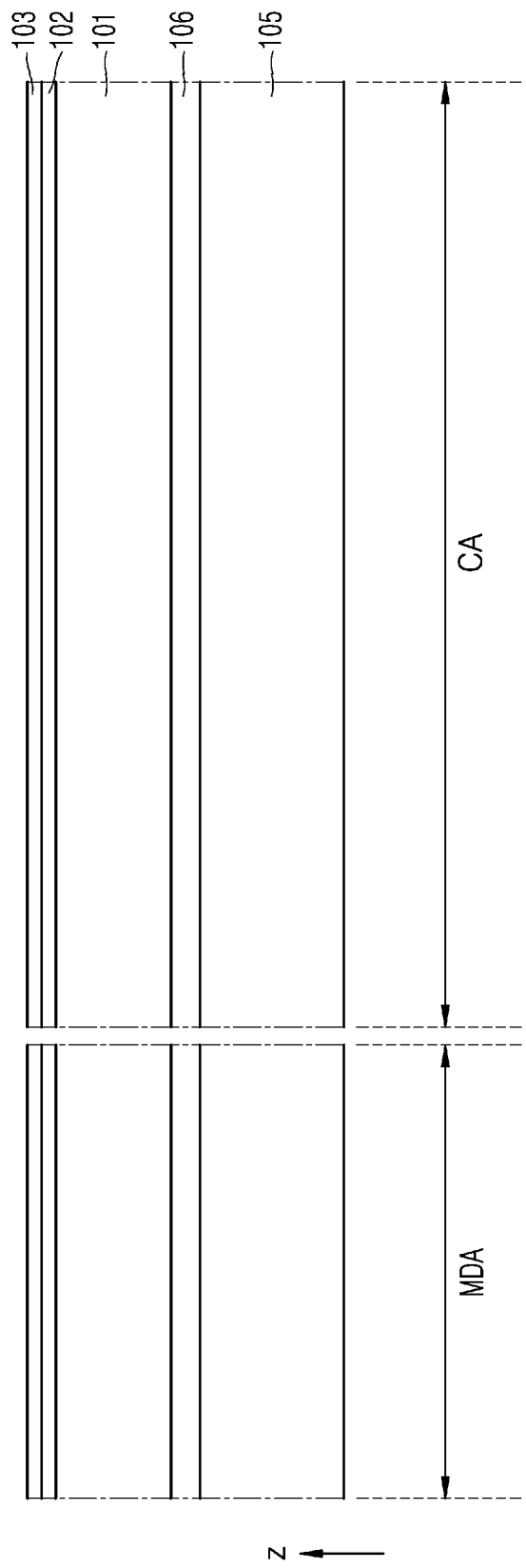

Referring to FIG. 16, the first barrier layer 103 may be formed on the compensation layer 102. The first barrier layer 103 may include (e.g., be) silicon oxide ($SiO_X$) and may have a thickness of 500 angstrom (Å) to 2,000 angstrom (Å). The first barrier layer 103 may have a value of about 1.3 to about 1.6 for light having a wavelength of 550 nm.

Figure 17:
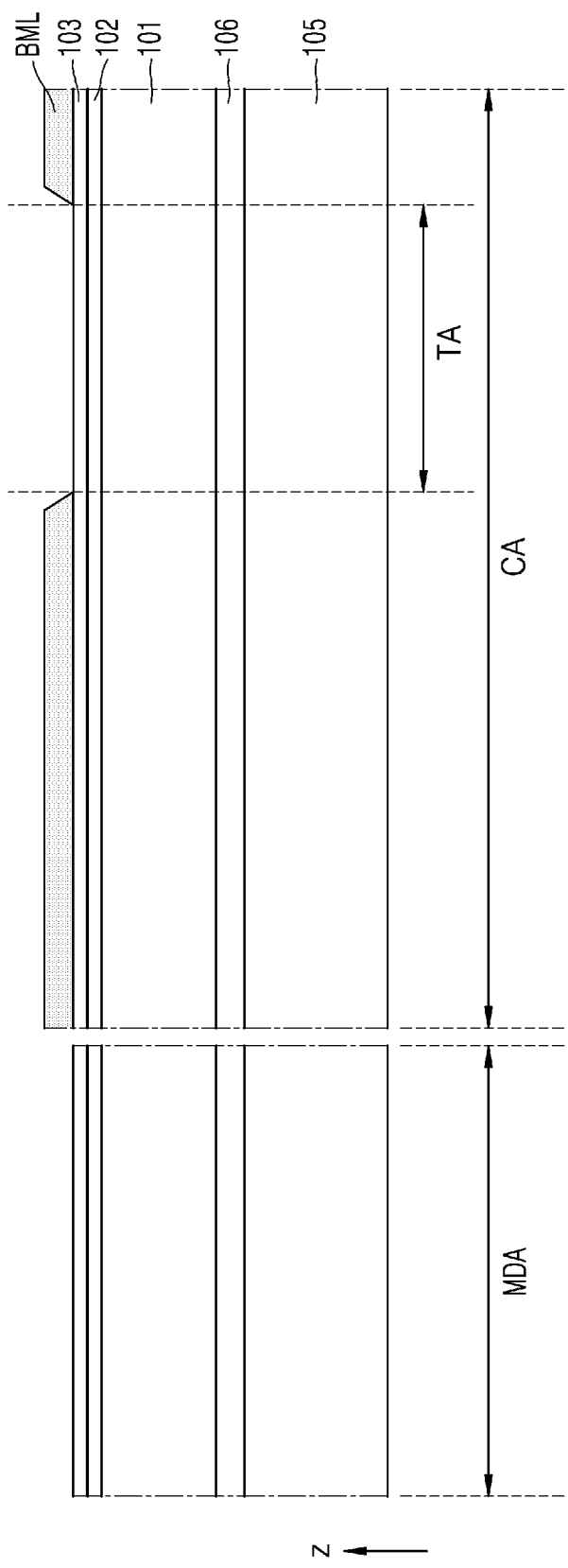

Referring to FIG. 17, the bottom metal layer BML may be formed on (e.g., directly on) the first barrier layer 103. The transmission area TA may be defined by the bottom metal layer BML. The bottom metal layer BML may not be arranged in the transmission area TA, and the transmission area TA may be defined (e.g., thereby defined). Because the bottom metal layer BML is not arranged in the transmission area TA, the light transmittance of the transmission area TA may improve.

Figure 18:
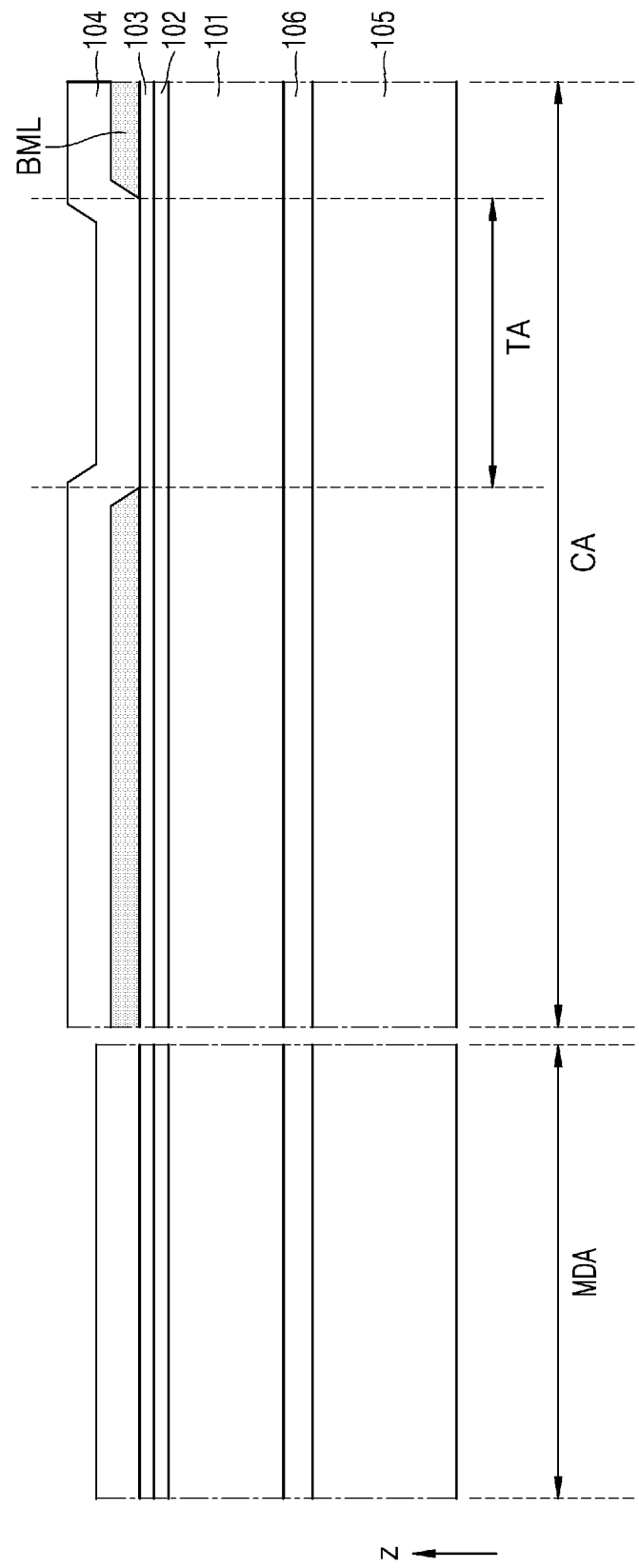

Referring to FIG. 18, the second barrier layer 104 may be formed on the bottom metal layer BML. The second barrier layer 104 may include (e.g., be) the same material as that included in the first barrier layer 103. The second barrier layer 104 may have a thickness of 2,000 angstrom (Å) to 4,000 angstrom (Å), and the refractive index of the second barrier layer 104 may have a value of 1.3 to 1.6 for light having a wavelength of 550 nm. In some embodiments, the bottom metal layer BML may be formed in the component area CA and not in the main display area MDA, and the second barrier layer 104 may be formed to cover the bottom metal layer BML in the component area CA and may be formed on the first barrier layer 103 in the main display area MDA.

Figure 19:
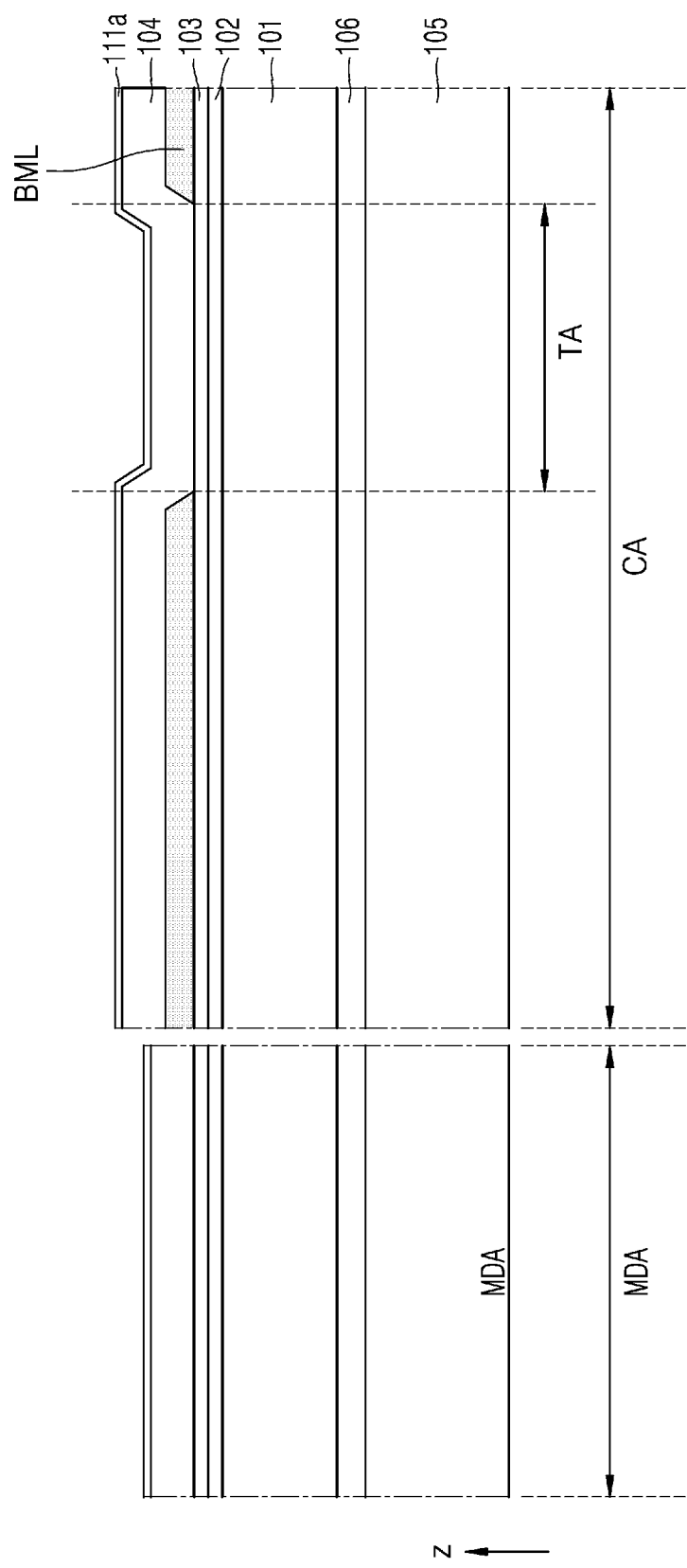

Referring to FIG. 19, the first buffer layer 111a may be formed on (e.g., formed directly on) the second barrier layer 104. The first buffer layer 111a may include (e.g., be) silicon nitride ($SiN_x$) and may have a thickness of 80 angstrom (Å) to 250 angstrom (Å). A refractive index of the first buffer layer 111a may have a value of 1.8 to 2 (2.0) for light having a wavelength of 550 nm.

Figure 20:
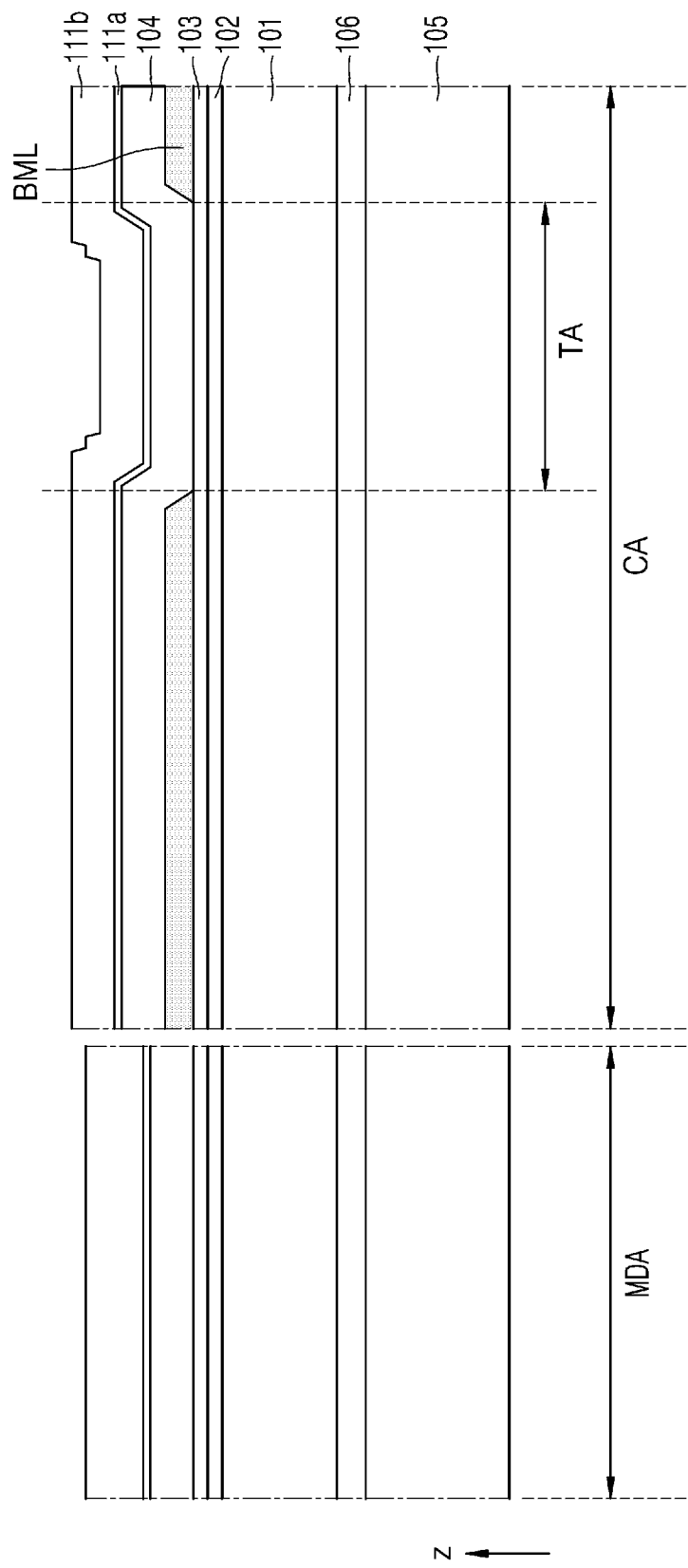

Referring to FIG. 20, the second buffer layer 111b may be formed on the first buffer layer 111a. The second buffer layer 111b may include (e.g., be) a material different from the material included in (e.g., composing) the first buffer layer 111a. For example, the second buffer layer 111b may include (e.g., be) silicon oxide ($SiO_x$). The second buffer layer 111b may have a thickness of 1,000 angstrom (Å) to 4,000 angstrom (Å). A refractive index of the second buffer layer 111b may have a value of 1.3 to 1.6 for light having a wavelength of 550 nm.

A main thin-film transistor, a main storage capacitor, and a main organic light-emitting diode may be formed on the second buffer layer 111b of (e.g., in) the main display area MDA, and an auxiliary thin-film transistor, an auxiliary storage capacitor, and an auxiliary organic light-emitting diode may be formed on the second buffer layer 111b of (e.g., in) the component area CA. A thin-film encapsulation layer may be formed to cover the main organic light-emitting diode and the auxiliary organic light-emitting diode.

Figure 21:
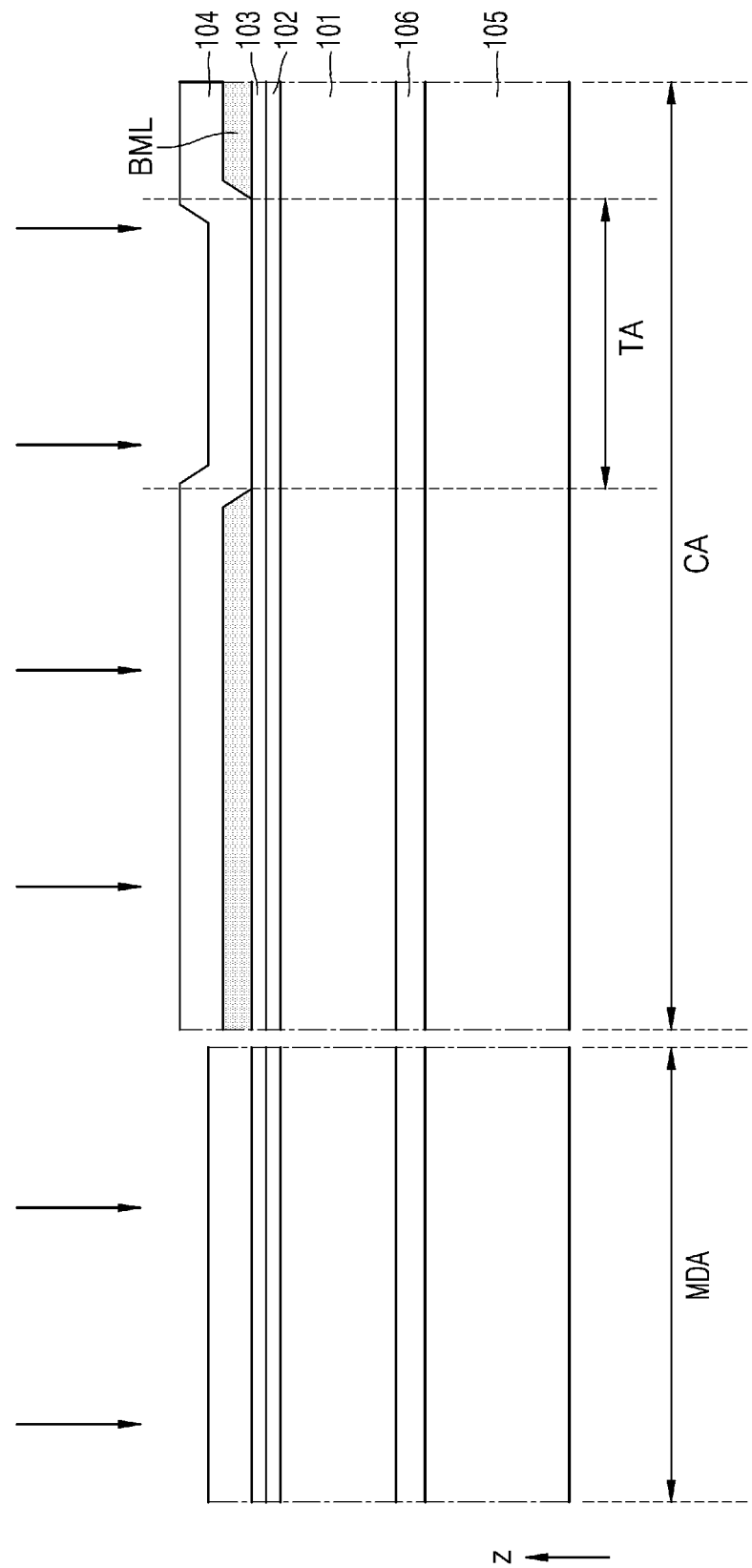
Figure 22:
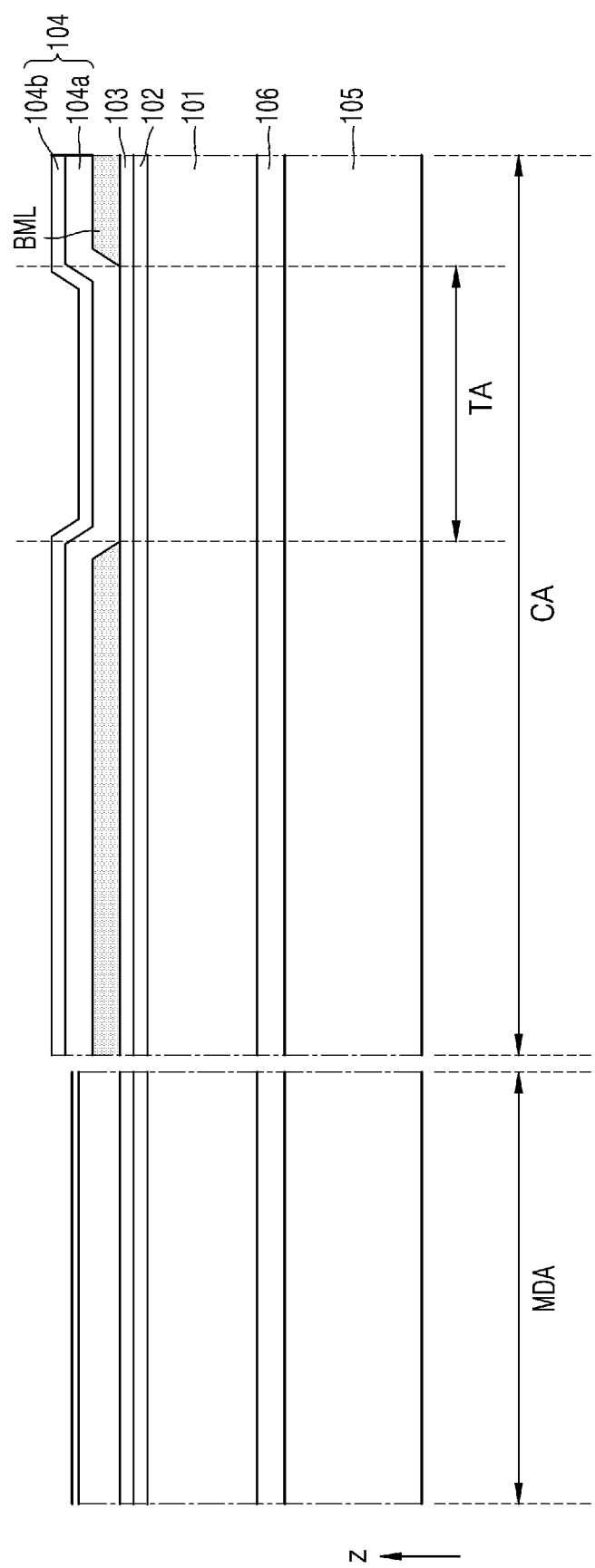

Referring to FIGS. 21 and 22, according to an embodiment, an operation of radiating plasma including (e.g., being) a chlorine ($Cl_2$) gas onto the upper surface of the second barrier layer 104 may be further performed after the operation of forming the second barrier layer 104 on the bottom metal layer BML.

By radiating plasma including (e.g., being) a chlorine ($Cl_2$) gas onto the upper surface of the second barrier layer 104, at least a portion of chlorine (Cl) may diffuse or permeate into the second barrier layer 104. Accordingly, the second barrier layer 104 may include the first layer 104a, and the second layer 104b including a larger amount of chlorine (Cl) than the first layer 104a.

According to an embodiment, by depositing the first buffer layer 111a on the second barrier layer 104 by utilizing (e.g., using) a gas including chlorine (Cl), for example, dichlorosilic acid ($SiH_2Cl_2$), trichlorosilic acid ($SiHCl_3$), and/or silicon tetrachloride ($SiCl_4$), at least a portion of chlorine (Cl) may diffuse or permeate into the second barrier layer 104, and thus the second barrier layer 104 may be included in a structure (e.g., may be included to have a structure) including the first layer 104a and the second layer 104b including a larger amount of chlorine (Cl) than the first layer 104a.

The inclusion of the second layer 104b including a high Cl content in the second barrier layer 104 may prevent, reduce, or minimize permeation of hydrogen into above the second barrier layer 104, so that the main thin-film transistor and the auxiliary thin-film transistor may have set or preset characteristics.

According to an embodiment as described above, the main thin-film transistor of the main display area and the auxiliary thin-film transistor of the component area have similar lower stack structures, and thus a difference between the characteristics of the main thin-film transistor and the auxiliary thin-film transistor may be reduced.

In addition, the reduction of the difference between the characteristics of the main thin-film transistor and the auxiliary thin-film transistor may prevent, reduce, or minimize generation of a difference between the brightnesses of the main display area and the component area.

It should be understood that embodiments described herein should be considered in a descriptive sense only and not for purposes of limitation. Descriptions of features and/or aspects within each embodiment should typically be considered as available for other similar features or aspects in other embodiments. While one or more embodiments have been described with reference to the drawings, it will be understood by those of ordinary skill in the art that various suitable changes in form and details may be made therein without departing from the spirit and scope of the present disclosure as defined by the following claims and equivalents thereof.

What is claimed is:

1. A display apparatus comprising:
a main display area; and
a component area comprising pixel groups spaced apart from each other and a transmission area between the pixel groups,
the display apparatus further comprising:
a substrate comprising a first base layer, a compensation layer, a first barrier layer, and a second barrier layer sequentially stacked on one another;
a bottom metal layer between the first barrier layer and the second barrier layer;
a buffer layer above the second barrier layer;
main display elements on the substrate of the main display area;
auxiliary display elements on the substrate of the component area; and
a thin film transistor comprising a semiconductor layer above the buffer layer,
wherein the buffer layer comprises:
a first buffer layer having a thickness of 80 Å to 250 Å; and
a second buffer layer on the first buffer layer and having a thickness of 1,000 Å to 4,000 Å,
wherein the second barrier layer comprises a first layer and a second layer on the first layer, and
wherein the second layer is greater in amount of chlorine than the first layer.

2. The display apparatus of claim 1, wherein the first buffer layer comprises silicon nitride, and the second buffer layer comprises silicon oxide.

3. The display apparatus of claim 1, wherein a refractive index of the first buffer layer is 1.8 to 2, and a refractive index of the second buffer layer is 1.3 to 1.6.

4. The display apparatus of claim 1, wherein a thickness of the compensation layer is 500 Å to 2,000 Å.

5. The display apparatus of claim 1, wherein the compensation layer comprises silicon oxynitride.

6. The display apparatus of claim 1, wherein a refractive index of the compensation layer is 1.65 to 1.75.

7. The display apparatus of claim 1, wherein a thickness of the first barrier layer is 500 Å to 2,000 Å.

8. The display apparatus of claim 1, wherein the first barrier layer comprises silicon oxide.

9. The display apparatus of claim 8, wherein the second barrier layer comprises a same material as the first barrier layer.

10. The display apparatus of claim 1, wherein a refractive index of the first barrier layer is 1.3 to 1.6.

11. The display apparatus of claim 1, wherein a thickness of the second barrier layer is 2,000 Å to 4,000 Å.

12. The display apparatus of claim 1, further comprising a second base layer below the first base layer, and a third barrier layer between the first base layer and the second base layer.

13. The display apparatus of claim 1, wherein the bottom metal layer comprises a first hole corresponding to the transmission area.

14. The display apparatus of claim 1, wherein the bottom metal layer is arranged to correspond to the auxiliary display elements.

15. The display apparatus of claim 1, wherein the bottom metal layer is directly on the first barrier layer.

16. The display apparatus of claim 1, further comprising a thin-film encapsulation layer that covers the main display elements and the auxiliary display elements,
wherein the thin-film encapsulation layer comprises at least one inorganic encapsulation layer and at least one organic encapsulation layer.

17. The display apparatus of claim 1, wherein the first buffer layer is directly on the second barrier layer.

18. The display apparatus of claim 1, further comprising a component arranged below the substrate to correspond to the component area.

19. A method of manufacturing the display apparatus of claim 1,
the method comprising:
forming the compensation layer on the first base layer;
forming the first barrier layer on the compensation layer;
forming the bottom metal layer on the first barrier layer;
forming the second barrier layer on the bottom metal layer; and
forming the buffer layer on the second barrier layer.

20. The method of claim 19, wherein the forming of the buffer layer comprises:
forming the first buffer layer on the second barrier layer; and
forming the second buffer layer on the first buffer layer.

21. The method of claim 20, wherein the forming of the first buffer layer comprises forming the first buffer layer on the second barrier layer by utilizing a gas comprising chlorine.

22. The method of claim 20, further comprising, before the forming of the first buffer layer, radiating plasma comprising chlorine ($Cl_2$) gas onto an upper surface of the second barrier layer.

23. The method of claim 20, wherein the first buffer layer comprises silicon nitride, and the second buffer layer comprises silicon oxide.

24. The method of claim 19, wherein a thickness of the first barrier layer is 500 Å to 2,000 Å.

25. The method of claim 19, wherein a thickness of the second barrier layer is 2,000 Å to 4,000 Å.

26. The method of claim 19, wherein materials of the first barrier layer and the second barrier layer are the same.

27. The display apparatus of claim 1, wherein the semiconductor layer is directly above the second buffer layer.

28. The display apparatus of claim 1, wherein the first buffer layer is directly on the second barrier layer, the second buffer layer is directly on the first buffer layer, and the semiconductor layer is directly on the second buffer layer.

* * * * *